US012770702B2

(12) United States Patent
Yonemura et al.

(10) Patent No.: US 12,770,702 B2
(45) Date of Patent: Oct. 20, 2026

(54) MAGNETIC DOMAIN WALL MOTION ELEMENT, MAGNETIC RECORDING ARRAY, AND MAGNETIC MEMORY

(71) Applicant: TDK CORPORATION, Tokyo (JP)

(72) Inventors: Shogo Yonemura, Tokyo (JP); Tatsuo Shibata, Tokyo (JP); Minoru Ota, Tokyo (JP)

(73) Assignee: TDK CORPORATION, Tokyo (JP)

( * ) Notice: Subject to any disclaimer, the term of this patent is extended or adjusted under 35 U.S.C. 154(b) by 140 days.

(21) Appl. No.: 18/702,662

(22) PCT Filed: Oct. 21, 2021

(86) PCT No.: PCT/JP2021/038964
§ 371 (c)(1),
(2) Date: Apr. 18, 2024

(87) PCT Pub. No.: WO2023/067770
PCT Pub. Date: Apr. 27, 2023

(65) Prior Publication Data
US 2024/0420785 A1 Dec. 19, 2024

(51) Int. Cl.
*H10B 61/00* (2023.01)
*G11C 11/16* (2006.01)
(Continued)

(52) U.S. Cl.
CPC ........ *G11C 19/0841* (2013.01); *G11C 11/161* (2013.01); *H10B 61/22* (2023.02); *H10N 50/10* (2023.02); *H10N 50/80* (2023.02)

(58) Field of Classification Search
CPC .............. G11C 11/161; G11C 11/1675; G11C 11/1659; G11C 11/16; G11C 19/0841; H10N 50/10; H10N 50/80; H10N 50/85; H10N 50/01; H10N 52/00; H10N 52/80; H10B 61/22; H10B 61/00
See application file for complete search history.

(56) References Cited

U.S. PATENT DOCUMENTS

2004/0188732 A1 9/2004 Fukuzumi
2010/0142264 A1 6/2010 Numata et al.
(Continued)

FOREIGN PATENT DOCUMENTS

JP 2004-349671 A 12/2004
JP 2006-310423 A 11/2006
(Continued)

OTHER PUBLICATIONS

Dec. 21, 2021 International Search Report issued in International Patent Application No. PCT/JP2021/038964.

*Primary Examiner* — Wael Fahmy
(74) *Attorney, Agent, or Firm* — Oliff PLC

(57) ABSTRACT

A magnetic domain wall motion element includes a wiring layer including a first ferromagnetic layer and configured to extend in a first direction, a second ferromagnetic layer, and a spacer layer sandwiched between the wiring layer and the second ferromagnetic layer. In any cross section of the wiring layer taken along a plane perpendicular to the first direction, a first thickness of the wiring layer at a center in a width direction is thinner than a second thickness of the wiring layer at a first outer. peripheral portion outside the center in the width direction.

14 Claims, 17 Drawing Sheets

(51) Int. Cl.

| | |
|---|---|
| ***G11C 19/08*** | (2006.01) |
| ***H10N 50/10*** | (2023.01) |
| ***H10N 50/80*** | (2023.01) |

(56) References Cited

U.S. PATENT DOCUMENTS

| | | | | |
|---|---|---|---|---|
| 2010/0193889 | A1 | 8/2010 | Nagahara et al. | |
| 2020/0244911 | A1 | 7/2020 | Sato et al. | |
| 2020/0273511 | A1 | 8/2020 | Ashida et al. | |
| 2021/0098690 | A1* | 4/2021 | Ashida | H10N 50/10 |

FOREIGN PATENT DOCUMENTS

| | | | |
|---|---|---|---|
| JP | 5360596 | B2 | 12/2013 |
| JP | 2020-141132 | A | 9/2020 |
| JP | 2021-057519 | A | 4/2021 |
| WO | 2007/020823 | A1 | 2/2007 |
| WO | 2019/039029 | A1 | 2/2019 |

* cited by examiner

MAGNETIC DOMAIN WALL MOTION ELEMENT, MAGNETIC RECORDING ARRAY, AND MAGNETIC MEMORY

TECHNICAL FIELD

The present disclosure relates to a magnetic domain wall motion element, a magnetic recording array, and a magnetic memory.

BACKGROUND ART

Attention is now being focused on next-generation non-volatile memories to replace flash memories and other devices that have reached their limits in miniaturization. For example, a magnetoresistive random access memory (MRAM), a resistive random access memory (ReRAM), a phase change random access memory (PCRAM) and the like are known as next-generation non-volatile memories.

An MRAM has a magnetoresistive element of which a resistance value changes according to a change in magnetization direction. A magnetic domain wall motion element is one aspect of the magnetoresistive element (for example, Patent Document 1).

The magnetic domain wall motion element has a resistance value that changes according to a position of a magnetic domain wall within a first ferromagnetic layer (a magnetic domain wall motion layer), and is thus expected to be used in multilevel recording and analog information processing (for example, Patent Documents 2 and 3).

CITATION LIST

Patent Document

[Patent Document 1]
Japanese Patent Publication No. 5360596
[Patent Document 2]
PCT International Publication No. WO 2019/39029
[Patent Document 3]
Japanese Unexamined Patent Application, First Publication No. 2021-57519

SUMMARY OF INVENTION

Technical Problem

The magnetic domain wall motion element is manufactured by processing a magnetic layer after deposition. The magnetic layer is damaged during the processing, and a magnetization at an end portion of the magnetic layer tends to become unstable after the processing. When the magnetization of the magnetic layer becomes unstable, magnetic properties of the magnetic domain wall motion element deteriorate. Increasing a thickness of the magnetic layer can curb deterioration of the magnetic properties, but increases an amount of drive current required to move the magnetic domain wall.

The present disclosure has been made in view of the above problems, and an object thereof is to provide a magnetic domain wall motion element and a magnetic recording array that have improved magnetization stability and a small amount of drive current.

Solution to Problem (1) A magnetic domain wall motion element according to a first aspect includes a wiring layer including a first ferromagnetic layer and configured to extend in a first direction, a second ferromagnetic layer, and a spacer layer sandwiched between the wiring layer and the second ferromagnetic layer. In any cross section of the wiring layer taken along a plane perpendicular to the first direction, a first thickness of the wiring layer at a center in a width direction is thinner than a second thickness of the wiring layer at a first outer peripheral portion outside the center in the width direction.

(2) In the magnetic domain wall motion element according to the aspect, the first thickness may be thinner than a third thickness of the wiring layer at a second outer peripheral portion that sandwiches the center together with the first outer peripheral portion in the width direction.

(3) On a first surface of the wiring layer on a side far from the spacer layer in the magnetic domain wall motion element according to the aspect, a first point at the center in the width direction may be closer to the spacer layer than a second point outside the center in the width direction.

(4) In the magnetic domain wall motion element according to the aspect, a second surface of the wiring layer that faces a first surface may be flatter than the first surface on the side far from the spacer layer.

(5) In the magnetic domain wall motion element according to the aspect, the wiring layer may include the first ferromagnetic layer and a nonmagnetic layer in order from a side closer to the spacer layer. In any cross section of the wiring layer taken along a plane perpendicular to the first direction, a fourth thickness of the nonmagnetic layer at a center in the width direction may be thinner than a fifth thickness of the nonmagnetic layer at the first outer peripheral portion outside the center in the width direction.

(6) In the magnetic domain wall motion element according to the aspect, an interface between the first ferromagnetic layer and the nonmagnetic layer may be flatter than a first surface of the wiring layer on a side far from the spacer layer.

(7) In the magnetic domain wall motion element according to the aspect, a resistance of the nonmagnetic layer may be higher than a resistance of the first ferromagnetic layer.

(8) In the magnetic domain wall motion element according to the aspect, the wiring layer may include the first ferromagnetic layer, a nonmagnetic layer, and a magnetic coupling layer containing a ferromagnetic material in order from a side closer to the spacer layer.

(9) In the magnetic domain wall motion element according to the aspect, the magnetic coupling layer may include a first magnetic coupling layer and a second magnetic coupling layer. The first magnetic coupling layer may be on the first outer peripheral portion, and the second magnetic coupling layer may be on a second outer peripheral portion that sandwiches the center together with the first outer peripheral portion in the width direction.

(10) In the magnetic domain wall motion element according to the aspect, each of the first magnetic coupling layer and the second magnetic coupling layer may include a plurality of pieces of magnetic material scattered in an island shape.

(11) The magnetic domain wall motion element according to the aspect may further include a first conductive layer and a second conductive layer. The first conductive layer and the second conductive layer may be spaced apart in the first direction and connected to the wiring layer. In a first surface of the wiring layer on the side far from the spacer layer, an overlapping region that overlaps the first conductive layer and the second conductive layer in a lamination direction may be flatter than a non-overlapping region other than the overlapping region.

(12) In any cross section of the wiring layer taken along a plane in the first direction in the magnetic domain wall motion element according to the aspect, a thickness of the wiring layer at a center in the first direction may be thinner than a thickness of the wiring layer outside the center in the first direction.

(13) A magnetic recording array according to a second aspect includes a plurality of magnetic domain wall motion elements according to the aspect.

(14) A magnetic memory according to a third aspect includes a plurality of magnetic domain wall motion elements according to the aspect.

Advantageous Effects of Invention

The magnetic domain wall motion element and the magnetic recording array according to the above aspects have improved magnetization stability and a small amount of drive current.

DESCRIPTION OF EMBODIMENTS

Figure 1:
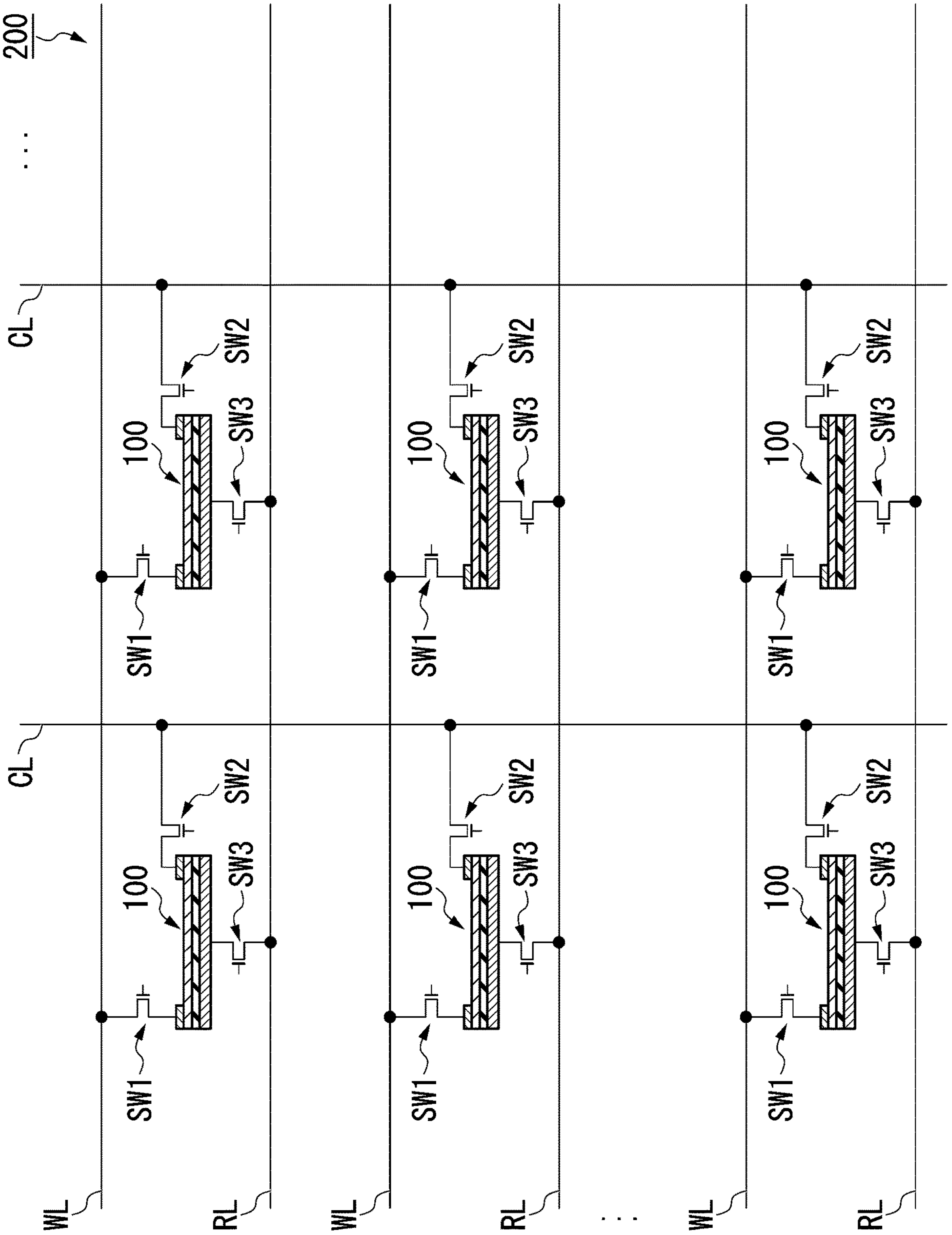
FIG. 1 is a configuration diagram of a magnetic recording array according to a first embodiment.

Hereinafter, this embodiment will be described in detail with reference to the drawings as appropriate. In the drawings used in the following description, characteristic parts of the present disclosure may be shown enlarged for convenience in order to make them easier to understand, and the dimensional ratios of each of components may differ from the actual ones. Materials, dimensions, and the like exemplified in the following description are merely examples, and the present disclosure is not limited thereto, and can be implemented with appropriate changes within the scope of achieving effects of the present disclosure.

First, directions are defined. An x direction and a y direction are directions substantially parallel to one surface of a substrate Sub (refer to FIG. 2) which will be described below. The x direction is a direction in which a wiring layer which will be described below extends. The y direction is a direction perpendicular to the x direction. The y direction is an example of a width direction. A z direction is a direction from the substrate Sub toward a magnetic domain wall motion element which will be described below. The z direction is an example of a lamination direction. In this specification, a +z direction may be expressed as "upward" and a −z direction as "downward," but these expressions are for convenience and do not define a direction of gravity.

In addition, in this specification. "extending in the x direction" means, for example, that a dimension in the x direction is larger than the smallest dimension among dimensions in the x direction, the y direction, and the z direction, and means, for example, that the dimension in the x direction is longer than the dimension in the y direction in plan view in the z direction. The same applies when extending in other directions. Furthermore, in this specification, "connection" is not limited to direct connection, and also includes indirect connection via a layer, and includes electrical connection.

"First Embodiment"

FIG. 1 is a configuration diagram of a magnetic recording array according to a first embodiment. The magnetic recording array 200 includes a plurality of magnetic domain wall motion elements 100, a plurality of first wirings WL, a plurality of second wirings CL, a plurality of third wirings RL, a plurality of first switching elements SW1, a plurality of second switching elements SW2, and a plurality of third switching elements SW3. The magnetic recording array 200 can be used for, for example, a magnetic memory, a product-sum operator, a neuromorphic device. a spin memristor. and a magneto-optical element.

Each of the first wirings WL is a writing wiring. Each of the first wirings WL electrically connects a power supply to one or more magnetic domain wall motion elements 100. The power supply is connected to one end of the magnetic recording array 200 in use.

Each of the second wirings CL is a common wiring. The common wiring is a wiring that can be used both when writing and reading data. Each of the second wirings CL electrically connects a reference potential to one or more magnetic domain wall motion elements 100. The reference potential is, for example, ground. One second wiring CL may be connected to only one magnetic domain wall motion element 100 or may be connected across a plurality of magnetic domain wall motion elements 100.

Each of the third wirings RL is a readout wiring. Each of third wirings RL electrically connects the power supply to one or more magnetic domain wall motion elements 100. The power supply is connected to one end of the magnetic recording array 200 in use.

In FIG. 1, each of the magnetic domain wall motion elements 100 is connected to the first switching element SW1, the second switching element SW2, and the third switching element SW3. The first switching element SW1 is connected between the magnetic domain wall motion element 100 and the first wiring WL. The second switching element SW2 is connected between the magnetic domain wall motion element 100 and the second wiring CL. The third switching element SW3 is connected between the magnetic domain wall motion element 100 and the third wiring RL.

When the first switching element SW1 and the second switching element SW2 connected to a predetermined magnetic domain wall motion element 100 are turned on, a writing current flows through the predetermined magnetic domain wall motion element 100. When the second switching element SW2 and the third switching element SW3 connected to the predetermined magnetic domain wall motion element 100 are turned on, a reading current flows through the predetermined magnetic domain wall motion element 100.

Each of the first switching element SW1, the second switching element SW2, and the third switching element SW3 is an element that controls a flow of current. Each of the first switching element SW1, the second switching element SW2, and the third switching element SW3 is, for example, a transistor, an element that utilizes a phase change in a crystal layer, such as an ovonic threshold switch (OTS), an element that utilizes a change in a band structure, such as a metal-insulator transition (MIT) switch, an element that utilizes a breakdown voltage, such as a Zener diode and an avalanche diode, and an element of which conductivity changes as atomic positions change.

Any one of the first switching element SW1, the second switching element SW2, and the third switching element SW3 may be shared by the magnetic domain wall motion element 100 connected to the same wiring. For example, when the first switching element SW1 is shared, one first switching element SW1 is provided upstream (at one end) of the first wiring WL. For example, when the second switching element SW2 is shared, one second switching element SW2 is provided upstream (at one end) of the second wiring CL. For example, when the third switching element SW3 is shared. one third switching element SW3 is provided upstream (at one end) of the third wiring RL.

Figure 2:
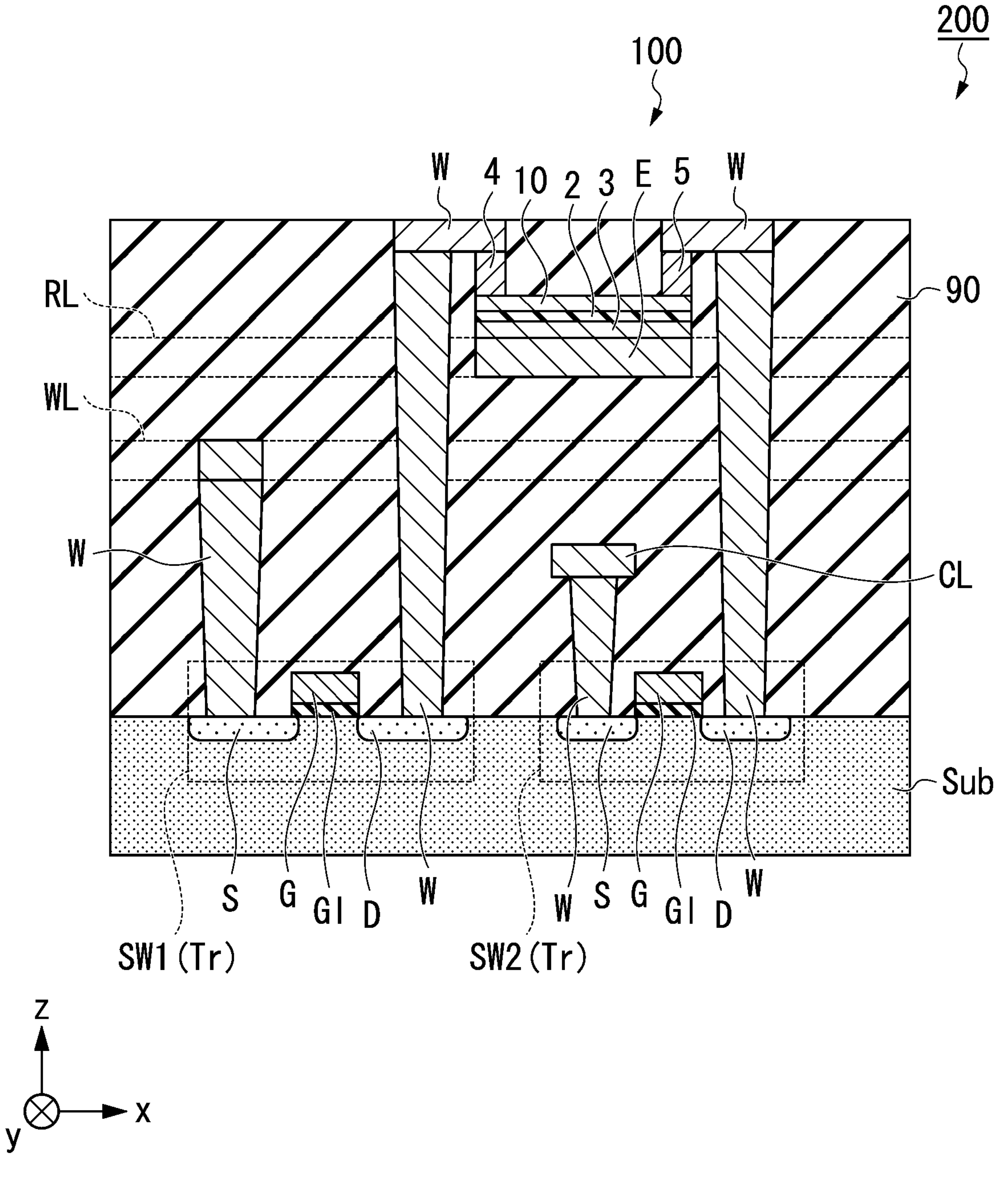
FIG. 2 is a cross-sectional view of a characteristic portion of the magnetic recording array according to the first embodiment.

FIG. 2 is a cross-sectional view of a main part of the magnetic recording array 200 according to the first embodiment. FIG. 2 is a cross section of one magnetic domain wall motion element 100 in FIG. 1 taken along an xz plane passing through a center of a width of a wiring layer 10 in the y direction.

The first switching element SW1 and the second switching element SW2 shown in FIG. 2 are transistors Tr. The transistor Tr has a gate electrode G, a gate insulating film GI, and a source S and a drain D formed on a substrate Sub. The source S and the drain D are determined by a direction of current flow, and a positional relationship may be reversed. The substrate Sub is, for example, a semiconductor substrate. The third switching element SW3 is electrically connected to the third wiring RL, and is located at a position shifted in the x direction or the y direction in FIG. 2, for example.

The transistor Tr and the magnetic domain wall motion element 100 are connected via a wiring W. The wiring W includes a through wiring that extends in the z direction and an in-plane wiring that extends in any direction within the xy plane. The first wiring WL and the transistor Tr, and the second wiring CL and the transistor Tr are also connected by the wiring W, respectively. The wiring W is within an insulating layer 90, for example. The magnetic domain wall motion element 100 and the third wiring RL are connected via an electrode E.

The insulating layer 90 is an insulating layer that insulates between wires of multilayer wiring and between elements. The magnetic domain wall motion element 100 and the transistor Tr are electrically separated by the insulating layer 90 except for the wiring W. The insulating layer 90 is made of, for example, silicon oxide ($SiO_x$). silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$). magnesium oxide (MgO), or the like.

Figure 3:
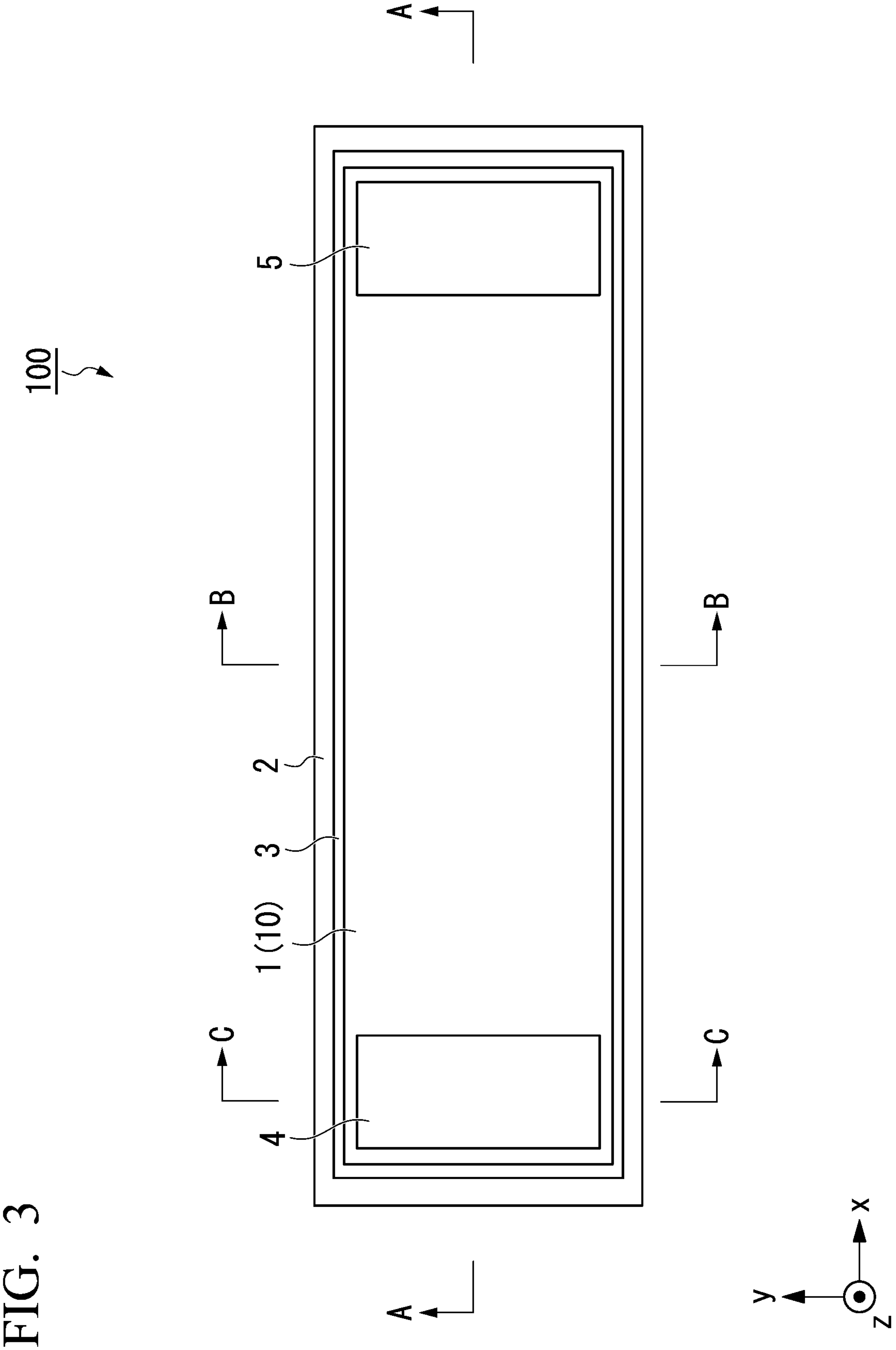
FIG. 3 is a plan view of a magnetic domain wall motion element according to the first embodiment.
Figure 4:
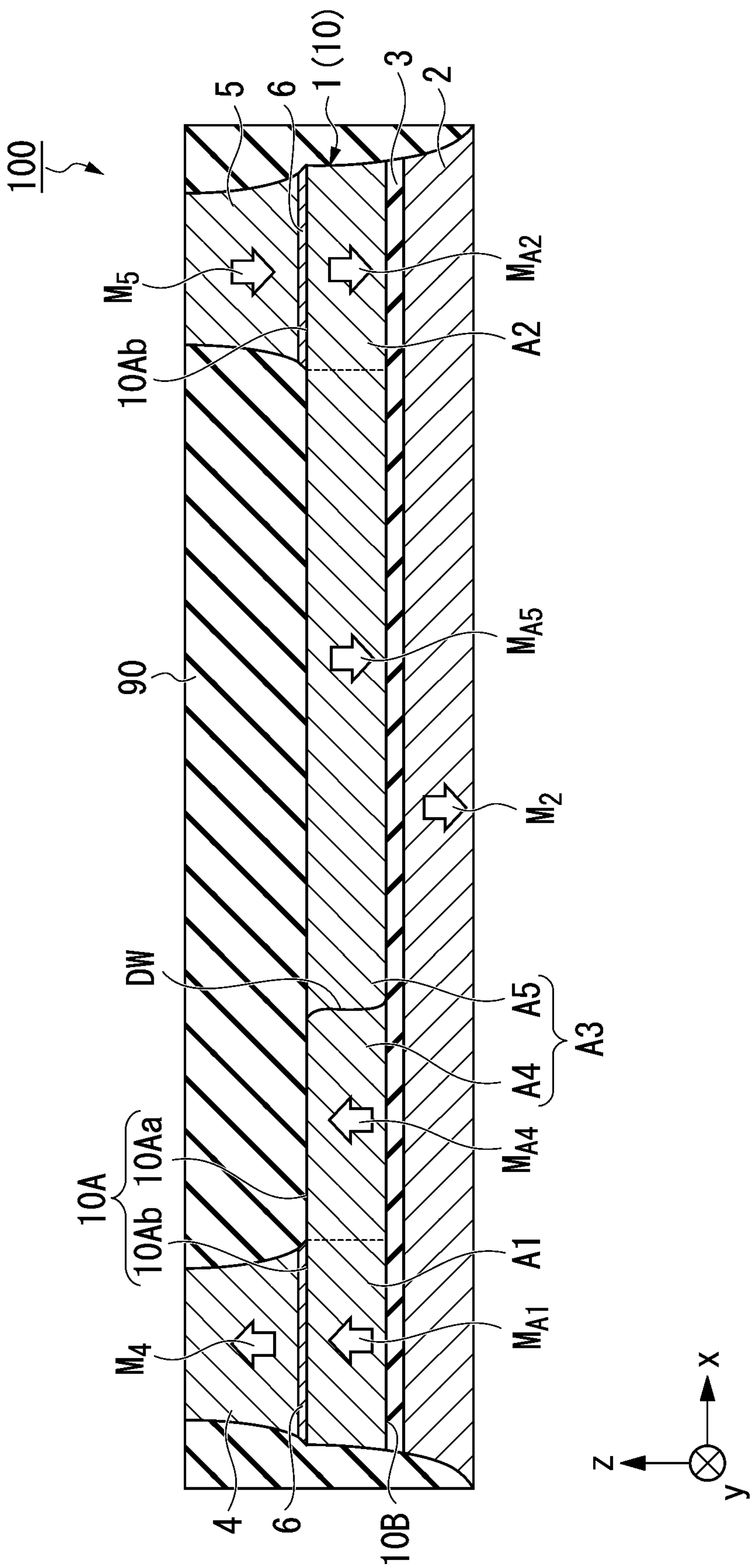
FIG. 4 is a cross-sectional view of the magnetic domain wall motion element according to the first embodiment.
Figure 5:
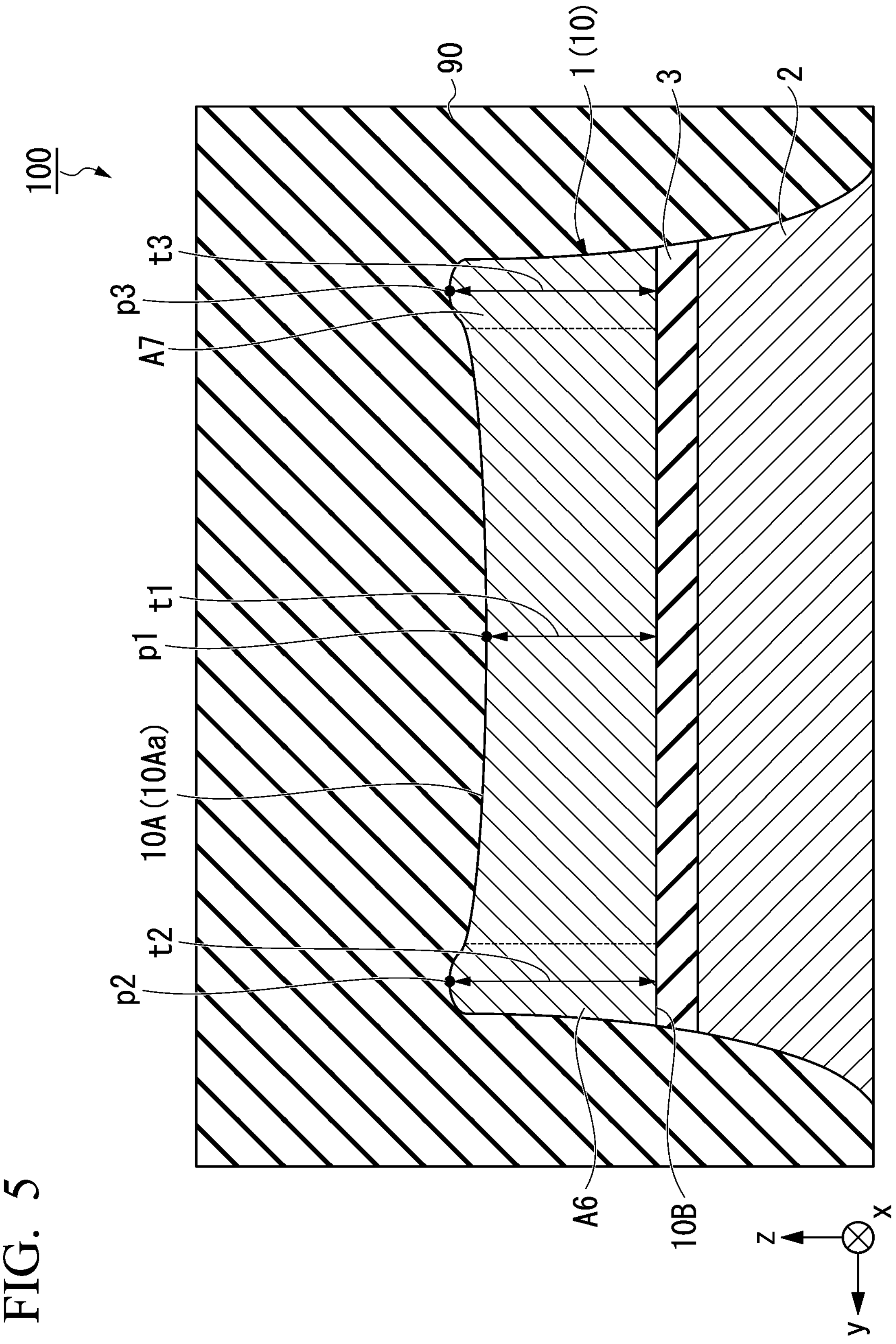
FIG. 5 is another cross-sectional view of the magnetic domain wall motion element according to the first embodiment.
Figure 6:
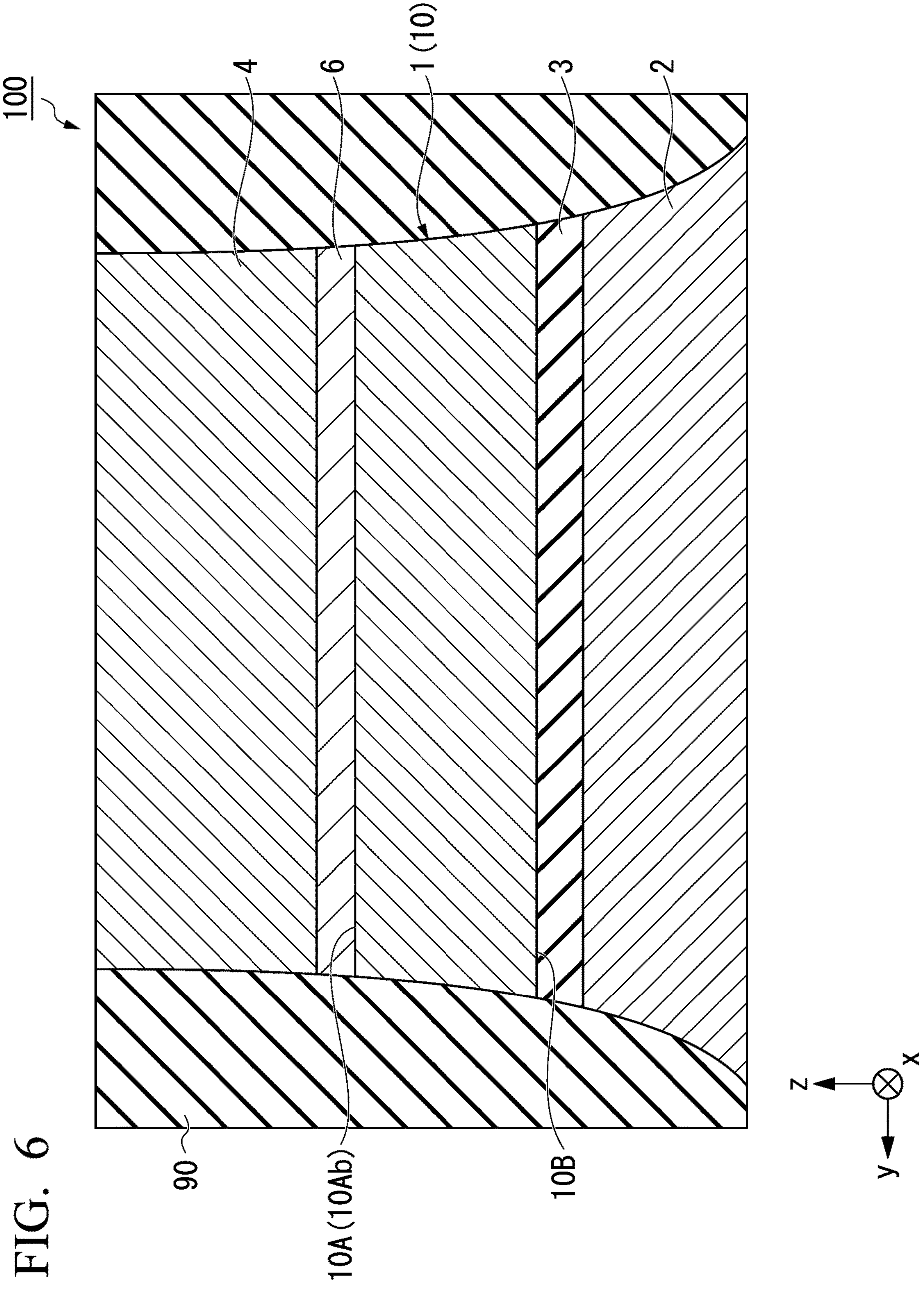
FIG. 6 is yet another cross-sectional view of the magnetic domain wall motion element according to the first embodiment.

FIG. 3 is a plan view of the magnetic domain wall motion element 100 in the z direction. FIG. 4 is a cross-sectional view of the magnetic domain wall motion element 100 taken along an xz plane passing through the center of the wiring layer 10 in the y direction. FIG. 4 is a cross section taken along line A-A in FIG. 3. FIG. 5 is a cross-sectional view of the magnetic domain wall motion element 100 taken along a yz plane passing through the center of the wiring layer 10 in the x direction. FIG. 5 is a cross section taken along line B-B in FIG. 3. FIG. 6 is a cross-sectional view of the magnetic domain wall motion element 100 taken along the yz plane passing through the first conductive layer 4. FIG. 6 is a cross section taken along line C-C in FIG. 3.

The magnetic domain wall motion element 100 includes, for example, a wiring layer 10, a second ferromagnetic layer 2, a spacer layer 3, a first conductive layer 4, a second conductive layer 5, and a nonmagnetic layer 6.

When data is written to the magnetic domain wall motion element 100, a current is passed between the first conductive layer 4 and the second conductive layer 5 along the wiring layer 10. When data is read from the magnetic domain wall motion element 100. a current is passed between the second ferromagnetic layer 2 and the first conductive layer 4 or the second conductive layer 5.

The wiring layer 10 extends in the x direction. The wiring layer 10 according to the first embodiment consists a first ferromagnetic layer 1.

The first ferromagnetic layer 1 extends in the x direction. The first ferromagnetic layer 1 has a plurality of magnetic domains therein and a magnetic domain wall DW at a boundary between the plurality of magnetic domains. The first ferromagnetic layer 1 is, for example, a layer in which information can be magnetically recorded by changing a magnetic state. The first ferromagnetic layer 1 may be called an analog layer, a magnetic recording layer, or a magnetic domain wall motion layer.

The first ferromagnetic layer 1 has a first region A1, a second region A2, and a third region A3. The first region A1 is a region that overlaps the first conductive layer 4 when seen in the z direction. The second region A2 is a region that overlaps the second conductive layer 5 when seen in the z direction. The third region A3 is a region other than the first region A1 and the second region A2 of the first ferromagnetic layer 1. The third region A3 is sandwiched between the first region A1 and the second region A2 in the x direction.

Magnetization $M_{A1}$ of the first region A1 is fixed by magnetization $M_4$ of the first conductive layer 4, for example. Magnetization $M_{A2}$ of the second region A2 is fixed, for example, by magnetization $M_5$ of the second conductive layer 5. Fixed magnetization means that the magnetization is not reversed during a normal operation of the magnetic domain wall motion element 100 (no external force exceeding expectations is applied). For example, the first region A1 and the second region A2 have opposite orientation directions of magnetization. In FIG. 4, the orientation directions of magnetization of the ferromagnetic material are schematically illustrated by arrows.

The third region A3 is a region in which the direction of magnetization changes and the magnetic domain wall DW can move. The third region A3 has a first magnetic domain A4 and a second magnetic domain A5. The first magnetic domain A4 and the second magnetic domain A5 have opposite orientation directions of magnetization. A boundary between the first magnetic domain A4 and the second magnetic domain A5 is the magnetic domain wall DW. For example, magnetization $M_{A4}$ of the first magnetic domain A4 is oriented in the same direction as the magnetization $M_{A1}$ of the first region A1. For example, magnetization $M_5$ of the second magnetic domain A5 is oriented in the same direction as the magnetization $M_{A2}$ of the second region A2. In principle, the magnetic domain wall DW moves within the third region A3 and does not invade the first region A1 and the second region A2.

When a ratio between the first magnetic domain A4 and the second magnetic domain A5 in the third region A3 changes, the magnetic domain wall DW moves. The magnetic domain wall DW is moved by applying a potential difference in the x direction of the third region A3 and causing the writing current to flow in the x direction. For example, when the writing current (for example, a current pulse) in the +x direction is applied to the third region A3, electrons flow in the −x direction opposite to the current, and thus the magnetic domain wall DW moves in the −x direction. When a current flows from the first magnetic domain A4 to the second magnetic domain A5, spin-polarized electrons in the second magnetic domain A5 reverse the magnetization of the first magnetic domain A4. By reversing the magnetization of the first magnetic domain A4, the magnetic domain wall DW moves in the −x direction.

The first ferromagnetic layer 1 includes, for example, a magnetic material. The first ferromagnetic layer 1 is, for example, a ferromagnetic material, a ferrimagnetic material. or a combination of them and an antiferromagnetic material. The first ferromagnetic layer 1 contains, for example, at least one element selected from a group consisting of Co, Ni, Fe, Pt, Pd, Gd, Tb, Mn, Ge, and Ga. The first ferromagnetic layer 1 is, for example, a laminated film of Co and Ni, a laminated film of Co and Pt, a laminated film of Co and Pd, a MnGa-based alloy, a GdCo-based alloy, a TbCo-based alloy, or the like. The ferrimagnetic material such as a MnGa-based alloy, a GdCo-based alloy, and a TbCo-based alloy has small saturation magnetization, and a threshold current required to move the magnetic domain wall DW becomes small. Further, a laminated film of Co and Ni, a laminated film of Co and Pt, and a laminated film of Co and Pd have a large coercive force, and a moving speed of the magnetic domain wall DW becomes slow. Examples of the antiferromagnetic material include $Mn_3X$ (X is Sn, Ge, Ga, Pt, Ir, or the like), CuMnAs, $Mn_2Au$, and the like.

The wiring layer 10 has a first outer peripheral portion A6 and a second outer peripheral portion A7 in the yz cross section. The first outer peripheral portion A6 and the second outer peripheral portion A7 are each located outside the center of the wiring layer 10 in the y direction. The first outer peripheral portion A6 and the second outer peripheral portion A7 are located at positions sandwiching the center of the wiring layer 10 in the y direction. The first outer peripheral portion A6 is a region having a predetermined width in the y direction from a first end of the wiring layer 10 in the y direction. The second outer peripheral portion A7 is a region having a predetermined width in the y direction from a second end of the wiring layer 10 in the y direction. The predetermined width is, for example, 10% of a width of the wiring layer 10 in the y direction.

In the cross section shown in FIG. 5, a first thickness t1 of the wiring layer 10 at the center of the wiring layer 10 in the y direction is thinner than a second thickness t2 at the first outer peripheral portion A6. Further. the first thickness t1 is thinner than a third thickness t3 at the second outer peripheral portion A7. The second thickness t2 is, for example, a maximum thickness of the wiring layer 10 in the yz cross section. The third thickness t3 is, for example, the maximum thickness or a thickness of the second thickest portion of the wiring layer 10 in the yz cross section. The portion at which the wiring layer 10 has the maximum thickness is not limited to an outer peripheral end of the wiring layer 10, but may be within an outer peripheral portion inward from the outer peripheral end.

The relationship among the first thickness t1, the second thickness t2, and the third thickness t3 described above does not need to be satisfied in all yz cross sections of the wiring layer 10. The third region A3 in the wiring layer 10 that does not overlap the first conductive layer 4 and the second conductive layer 5 in the z direction often satisfies the above relationship. As shown in FIG. 6, the first region A1 that overlaps the first conductive layer 4 in the z direction does not need to satisfy the above relationship. Similarly, the second region A2 that overlaps the second conductive layer 5 in the z direction does not need to satisfy the above relationship.

A first surface 10A of the wiring layer 10 includes a non-overlapping region 10Aa that does not overlap the first conductive layer 4 and the second conductive layer 5 in the z direction, and an overlapping region 10Ab that overlaps the first conductive layer 4 or the second conductive layer 5 in the z direction. The first surface 10A is a surface of the wiring layer 10 on the side far from the spacer layer 3.

As shown in FIG. 5, in the non-overlapping region 10Aa, the first surface 10A is curved in the z direction with respect to the xy plane. In the non-overlapping region 10Aa, the first surface 10A is curved such that a first point p1 located at the center of the first surface 10A in the y direction approaches the spacer layer 3. The first point p1 is closer to the spacer layer 3 than a second point p2. The second point p2 is located outside the first point p1 in the y direction. Further, the first point p1 is closer to the spacer layer 3 than a third point p3. The third point p3 and the second point p2 sandwich the first point p1 in the y direction. The second point p2 is, for example, located on the first outer peripheral portion A6. The third point p3 is, for example, located on the second outer peripheral portion A7. For example, in the non-overlapping region 10Aa, the first surface 10A has a maximum height at the second point p2 or a third point p3, and a minimum height at the first point p1.

A second surface 10B facing the first surface 10A in the non-overlapping region 10Aa is flatter than the first surface 10A. Flatness means that a difference between the maximum height and the minimum height in the z direction is small. For example, the difference between the maximum height and the minimum height of the second surface 10B is smaller than a difference in height in the z direction between the second point p2 or the third point p3 and the first point p1 of the first surface 10A. Further, for example, a curvature of the first surface 10A in the non-overlapping region 10Aa is larger than a curvature of the second surface 10B. The curvature is, for example, determined from an image obtained by a scanning electron microscope (SEM) or a transmission electron microscope (TEM) at a magnification of 100,000 times or less, and negligible minute irregularities on the first surface 10A and the second surface 10B are not converted.

On the other hand, as shown in FIG. 6, the first surface 10A in the overlapping region 10Ab is flatter than the first surface 10A in the non-overlapping region 10Aa. For example, the difference between the maximum height and the minimum height of the first surface 10A in the overlapping region 10Ab is smaller than the difference in height in the z direction between the second point p2 or the third point p3 and the first point p1 of the first surface 10A in the non-overlapping region 10Aa. Further, for example, the curvature of the first surface 10A in the non-overlapping region 10Aa is larger than the curvature of the first surface 10A in the overlapping region 10Ab.

A distance between the first surface 10A and the second surface 10B in the overlapping region 10Ab (that is, a thickness of the first region A1 or the second region A2) is approximately constant. Approximately constant means that each distance (thickness) measured at different positions in the y direction is within a range of 10% of an average value based on the average value.

The second ferromagnetic layer 2 is located at a position sandwiching the spacer layer 3 together with the first ferromagnetic layer 1. Magnetization $M_2$ of the second ferromagnetic layer 2 is more difficult to reverse than the magnetizations $M_{A4}$ and $M_{A5}$ of the third region A3 of the first ferromagnetic layer 1. The magnetization $M_2$ of the second ferromagnetic layer 2 is fixed without changing a direction thereof when an external force that reverses the magnetization of the third region A3 is applied. The second ferromagnetic layer 2 may be called a reference layer or a pinned layer.

The second ferromagnetic layer 2 includes a ferromagnetic material. The second ferromagnetic layer 2 includes, for example, a material that easily produces a coherent tunnel effect with the first ferromagnetic layer 1. The second ferromagnetic layer 2 includes, for example, a metal selected from a group consisting of Cr, Mn, Co, Fe, and Ni, and an alloy containing one or more of the metals, an alloy containing the metals and at least one or more elements of B, C, and N, and the like. The second ferromagnetic layer 2 is, for example, Co—Fe, Co—Fe—B, or Ni—Fe.

The second ferromagnetic layer 2 may be, for example, a Heusler alloy. The Heusler alloy is a half metal and has high spin polarizability. The Heusler alloy is an intermetallic compound with a chemical composition of XYZ or $X_2YZ$. X is a transition metal element or noble metal element of Co, Fe, Ni, or Cu group on the periodic table. Y is Mn, V, Cr, or a transition metal of Ti group, or an elemental species of X, and Z is a typical element of groups III to V. Examples of the Heusler alloy include $Co_2FeSi$. $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

Further, the second ferromagnetic layer 2 may have a synthetic structure configured of a ferromagnetic layer and a nonmagnetic layer, or a synthetic structure configured of an antiferromagnetic layer, a ferromagnetic layer, and a nonmagnetic layer.

In the latter case, a magnetization direction of the second ferromagnetic layer 2 is strongly held by the antiferromagnetic layer in the synthetic structure. Therefore, the magnetization of the second ferromagnetic layer 2 is less susceptible to external influences. When the magnetization of the second ferromagnetic layer 2 is oriented in the Z direction (the magnetization of the second ferromagnetic layer 2 is made into a perpendicular magnetization film), for example, it is preferable to further include a Co/Ni laminated film, a Co/Pt laminated film, or the like.

The spacer layer 3 is sandwiched between the first ferromagnetic layer 1 and the second ferromagnetic layer 2. The spacer layer 3 is, for example, on the second ferromagnetic layer 2.

The spacer layer 3 is made of, for example, a nonmagnetic insulator, a semiconductor, or a metal. The nonmagnetic insulator includes, for example, $Al_2O_3$, $SiO_2$, MgO, $MgAl_2O_4$, and materials in which some of Al, Si, and Mg are replaced with Zn, Be, Ga, Ti, or the like. The materials have a large band gap and excellent insulating properties. When the spacer layer 3 is made of a nonmagnetic insulator, the spacer layer 3 is a tunnel barrier layer. Examples of the nonmagnetic metal include Cu, Au, Ag, and the like. Examples of the nonmagnetic semiconductor include Si, Ge, $CuInSe_2$, $CuGaSe_2$, Cu (In, Ga) $Se_2$, and the like.

A thickness of the spacer layer 3 is, for example, 20 Å or more, and may be 25 Å or more. The thickness of the spacer layer 3 is approximately constant. When the spacer layer 3 is thick, a resistance area product (RA) of the magnetic domain wall motion element 100 becomes large. The resistance area product (RA) of the magnetic domain wall motion element 100 is preferably $1\times10^4\ \Omega\ \mu m^2$ or more, more preferably $5\times10^4\ \Omega\ \mu m^2$ or more. The resistance area product (RA) of the magnetic domain wall motion element 100 is expressed as a product of an element resistance of one magnetic domain wall motion element 100 and an element cross-sectional area of the magnetic domain wall motion element 100 (an area of a cross section obtained by cutting the spacer layer 3 along the xy plane).

Each of the first conductive layer 4 and the second conductive layer 5 is connected to the wiring layer 10. The first conductive layer 4 and the second conductive layer 5 are spaced apart and connected to different positions of the wiring layer 10 in the x direction. For example, the first conductive layer 4 is connected to a first end of the wiring layer 10, and the second conductive layer 5 is connected to a second end of the wiring layer 10. The nonmagnetic layer 6 may be provided between the first conductive layer 4 and the wiring layer 10 or between the second conductive layer 5 and the wiring layer 10. The nonmagnetic layer 6 is made of, for example, Pd, Pt, Ta, W, or the like.

Each of the first conductive layer 4 and the second conductive layer 5 contains, for example, a ferromagnetic material. The first conductive layer 4 and the second conductive layer 5 include, for example, the same material as the second ferromagnetic layer 2. The first conductive layer 4 fixes the magnetization $M_{A1}$ of the first region A1. The second conductive layer 5 fixes the magnetization $M_{A2}$ of the second region A2.

The first conductive layer 4 and the second conductive layer 5 do not need to be made of a ferromagnetic material. When the first conductive layer 4 or the second conductive layer 5 does not contain a ferromagnetic material, a movement range of the magnetic domain wall DW is controlled by a change in a current density of the current flowing through the wiring layer 10. The current density of the current flowing through the wiring layer 10 rapidly decreases at a position overlapping the first conductive layer 4 or the second conductive layer 5 in the z direction. A moving speed of the magnetic domain wall DW is proportional to the current density. It is difficult for the magnetic domain wall DW to invade the first region A1 and the second region A2 in which the moving speed rapidly decreases.

Shapes of the first conductive layer 4 and the second conductive layer 5 in plan view seen in the z direction are not particularly limited. The shapes of the first conductive layer 4 and the second conductive layer 5 in plan view seen in the z direction are, for example, rectangular, circular, elliptical, oval, or the like.

The direction of magnetization of each layer of the magnetic domain wall motion element 100 can be confirmed, for example, by measuring a magnetization curve. The magnetization curve can be measured using, for example, a magneto optical kerr effect (MOKE). The measurement by MOKE is a measurement method performed by making linearly polarized light incident on an object to be measured and using a magneto optical effect (a magnetic Kerr effect) that causes rotation of a polarization direction thereof.

The magnetic domain wall motion element 100 is formed by a lamination step of laminating each layer and a processing step of processing a part of each layer into a predetermined shape.

First, in the lamination step, a ferromagnetic layer, a nonmagnetic layer, a ferromagnetic layer, a stopper layer, and a conductive layer are laminated in this order. The lamination of each of the layers can be performed using a sputtering method, a chemical vapor deposition (CVD) method, an electron beam evaporation method (EB evaporation method), an atomic laser deposition method, or the like.

First, laminated films are processed into a rectangular shape extending in the x direction. Through processing, the ferromagnetic layer closer to the substrate Sub becomes the second ferromagnetic layer 2, the nonmagnetic layer becomes the spacer layer 3, and the ferromagnetic layer farther from the substrate Sub becomes the first ferromagnetic layer 1. Then, the periphery of the rectangular laminate is filled with an insulator.

Next, a mask is formed on portions of the conductive layer that will become the first conductive layer 4 and the second conductive layer 5. Then, the laminate is processed through the mask. The processing is performed, for example, by etching (for example, Ar etching). The etching progresses to the stopper layer, and the conductive layer is divided into the first conductive layer 4 and the second conductive layer 5. A part of the stopper layer is removed to form the nonmagnetic layer 6.

The first surface 10A in the non-overlapping region 10Aa of the wiring layer 10 is curved by adjusting a difference in etching speed between the insulator and the conductive layer around the laminate as etching conditions. The first surface 10A in the overlapping region 10Ab of the wiring layer 10 is covered with the first conductive layer 4 or the second conductive layer 5 and is not processed.

In the magnetic domain wall motion element 100 according to the first embodiment, thicknesses (a second thickness t2 and a third thickness t3) of the first outer peripheral portion A6 and the second outer peripheral portion A7 which are susceptible to processing damage are thicker than a thickness (a first thickness t1) of a central portion. When the thickness is thick, magnetic moments of the first outer peripheral portion A6 and the second outer peripheral portion A7 will be large, and the magnetization will be stabilized even when processing damage has occurred. Since the central portion is less susceptible to processing damage, the magnetization is stable even when the first thickness t1 is small. That is, in the magnetic domain wall motion element 100, the magnetization of the first ferromagnetic layer 1 is stable.

Further, in the magnetic domain wall motion element 100, compared to a case in which the first surface 10A is not curved, the first thickness t1 is thinner than the second thickness t2 and the third thickness t3, and a cross-sectional area of the yz cross section of the wiring layer 10 is small. The magnetic domain wall DW moves as a current higher than a critical current density flows along the wiring layer 10. When the cross-sectional area of the wiring layer 10 is small, an amount of current required to achieve the critical current density can be reduced.

Although the first embodiment has been described in detail above, the first embodiment is not limited to such a configuration, and various modifications are possible.

(First Modified Example)

Figure 7:
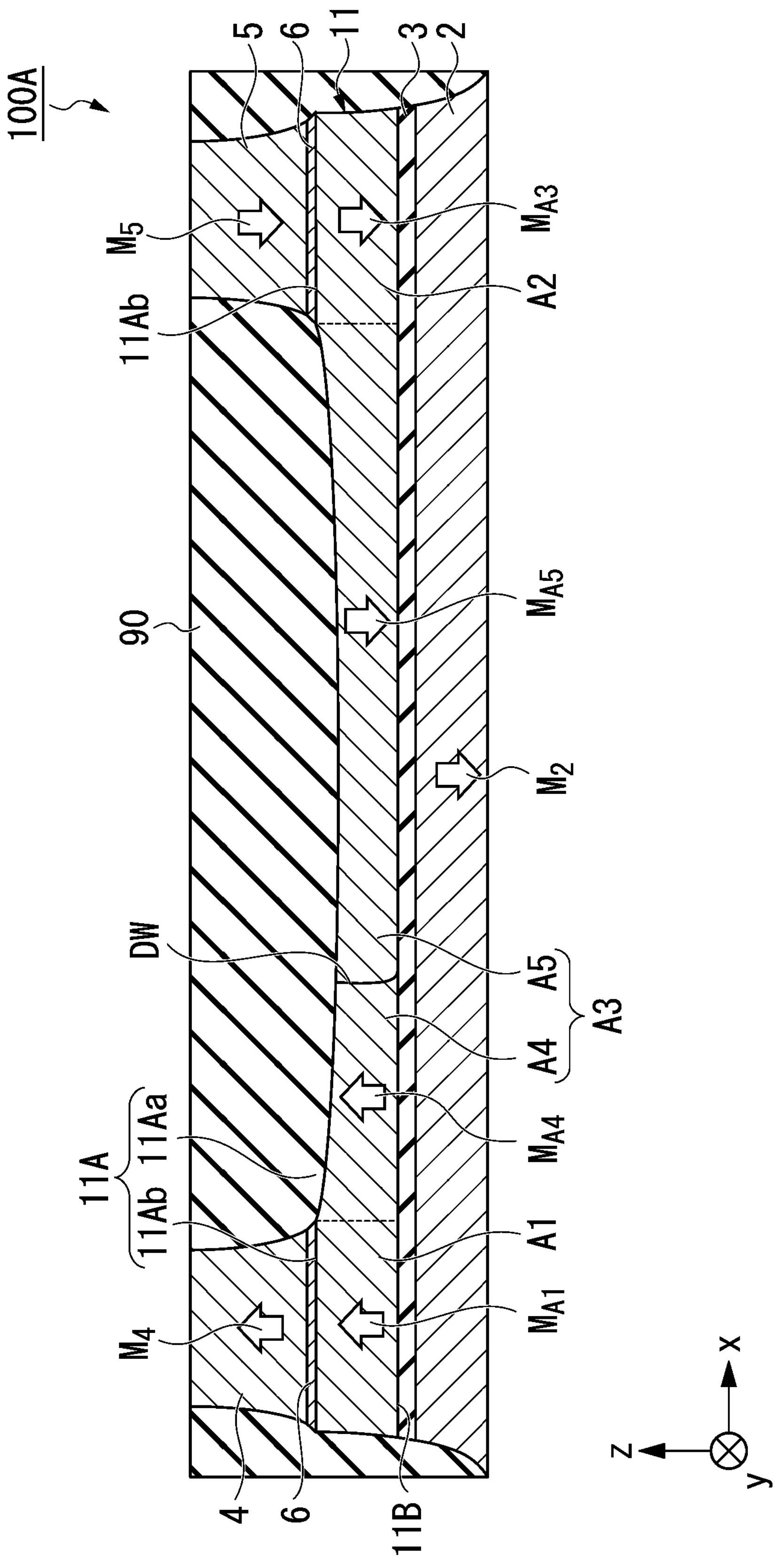
FIG. 7 is a cross-sectional view of a magnetic domain wall motion element according to a first modified example.

FIG. 7 is a cross-sectional view of a magnetic domain wall motion element 100A according to a first modified example. FIG. 7 is a cross-sectional view of the magnetic domain wall motion element 100A taken along an xz plane passing through the center of the wiring layer 11 in the y direction. A plan view and a yz cross-sectional view of the magnetic domain wall motion element 100A are the same as the plan view and the yz cross-sectional view of the magnetic domain wall motion element 100. In the magnetic domain wall motion element 100A, the same components as those in the magnetic domain wall motion element 100 are designated by the same reference numerals, and descriptions thereof will be omitted.

A wiring layer 11 differs from the wiring layer 10 in that, also in the xz cross section, a first surface 11A is curved in the z direction with respect to the xy plane. In the first surface 11A. the non-overlapping region 11Aa is curved, and the overlapping region 11Ab is flat. Further, a second surface 11B is flat.

In the xz cross section, a thickness of the wiring layer 11 at the center in the x direction is thinner than a thickness of the wiring layer 11 outside the center in a first direction. For example, in the xz cross section, the thickness of the wiring layer 11 at the center of the third region A3 in the x direction is thinner than the thickness of the wiring layer 11 at the first region A1 and the second region A2.

The magnetic domain wall motion element 100A according to the first modified example can achieve the same effects as in the magnetic domain wall motion element 100. Further, since the first surface 11A of the wiring layer 11 is curved, a surface area of the first surface 11A becomes large, and heat generated in the wiring layer 11 can be efficiently dissipated.

(Second Modified Example)

Figure 8:
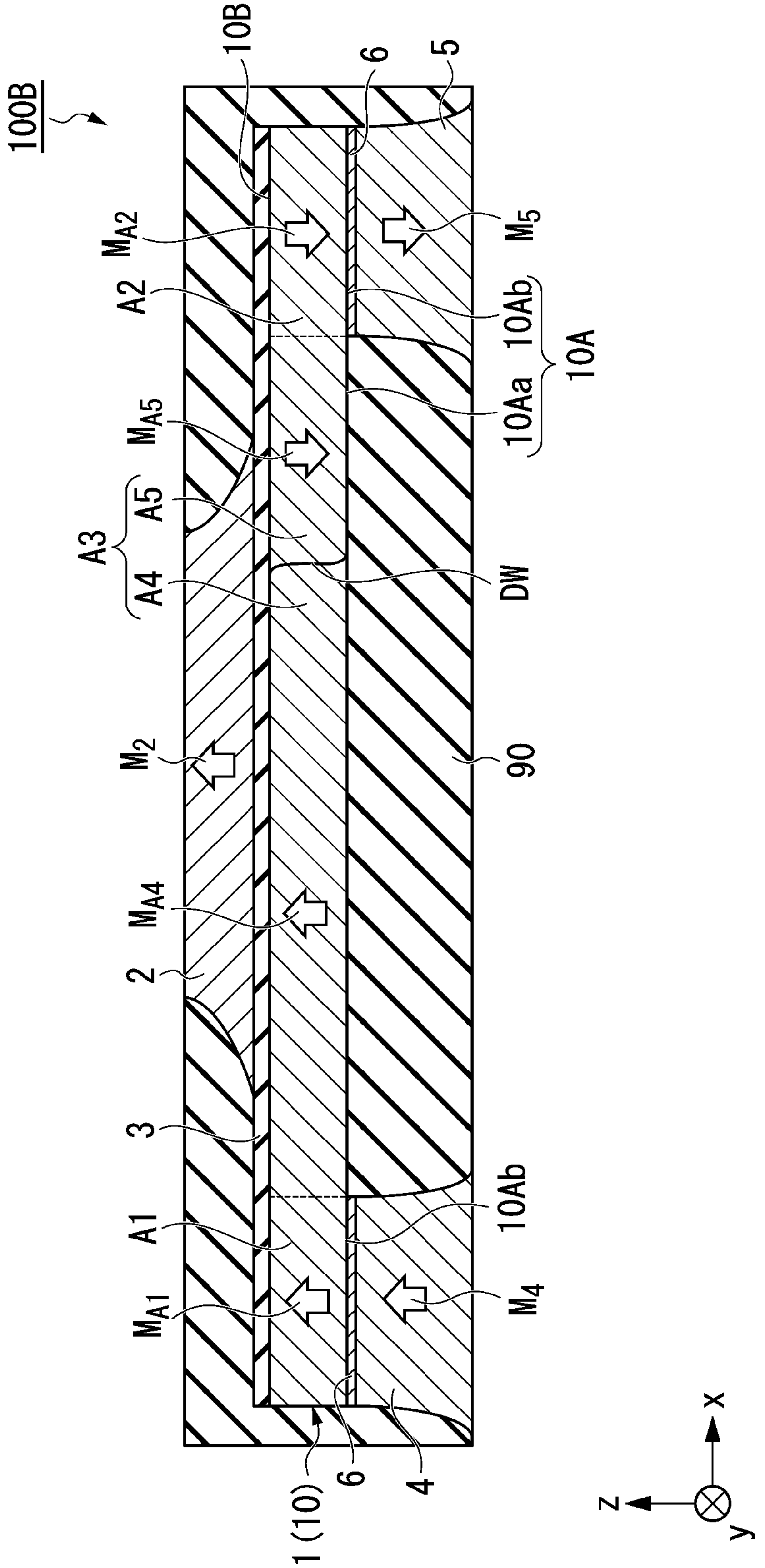
FIG. 8 is a cross-sectional view of a magnetic domain wall motion element according to a second modified example.
Figure 9:
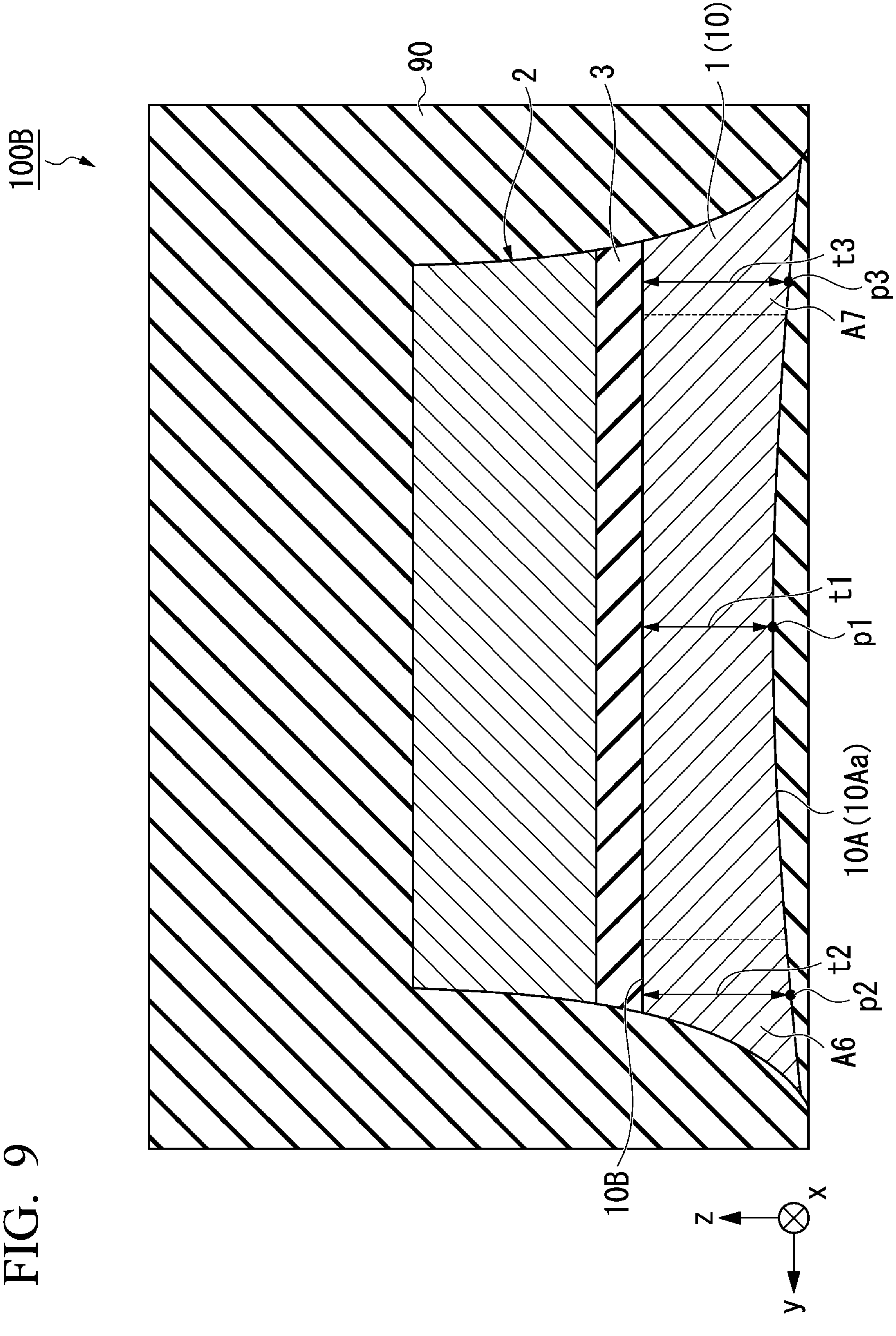
FIG. 9 is another cross-sectional view of the magnetic domain wall motion element according to the second modified example.

FIGS. 8 and 9 are cross-sectional views of a magnetic domain wall motion element 100B according to a second modified example. FIG. 8 is a cross-sectional view of the magnetic domain wall motion element 100A taken along an xz plane passing through the center of the wiring layer 10 in the y direction. FIG. 9 is a cross-sectional view of the magnetic domain wall motion element 100B taken along a yz plane passing through the center of the wiring layer 10 in the x direction. In the magnetic domain wall motion element 100B, the same components as those in the magnetic domain wall motion element 100 are designated by the same reference numerals, and description thereof will be omitted.

Whereas the magnetic domain wall motion element 100 had a bottom pin structure in which the second ferromagnetic layer 2 was closer to the substrate Sub than the first ferromagnetic layer 1, the magnetic domain wall motion element 100B has a top pin structure in which the second ferromagnetic layer 2 is farther from the substrate Sub than the first ferromagnetic layer 1.

In the magnetic domain wall motion element 100B, the first surface 10A is curved by processing a base on which the wiring layer 10 is laminated into a semi-cylindrical shape.

In the magnetic domain wall motion element 100B according to the first modified example, the positional relationship between the first ferromagnetic layer 1 and the second ferromagnetic layer 2 is simply reversed, and the same effects as in the magnetic domain wall motion element 100 can be obtained.

(Third Modified Example)

Figure 10:
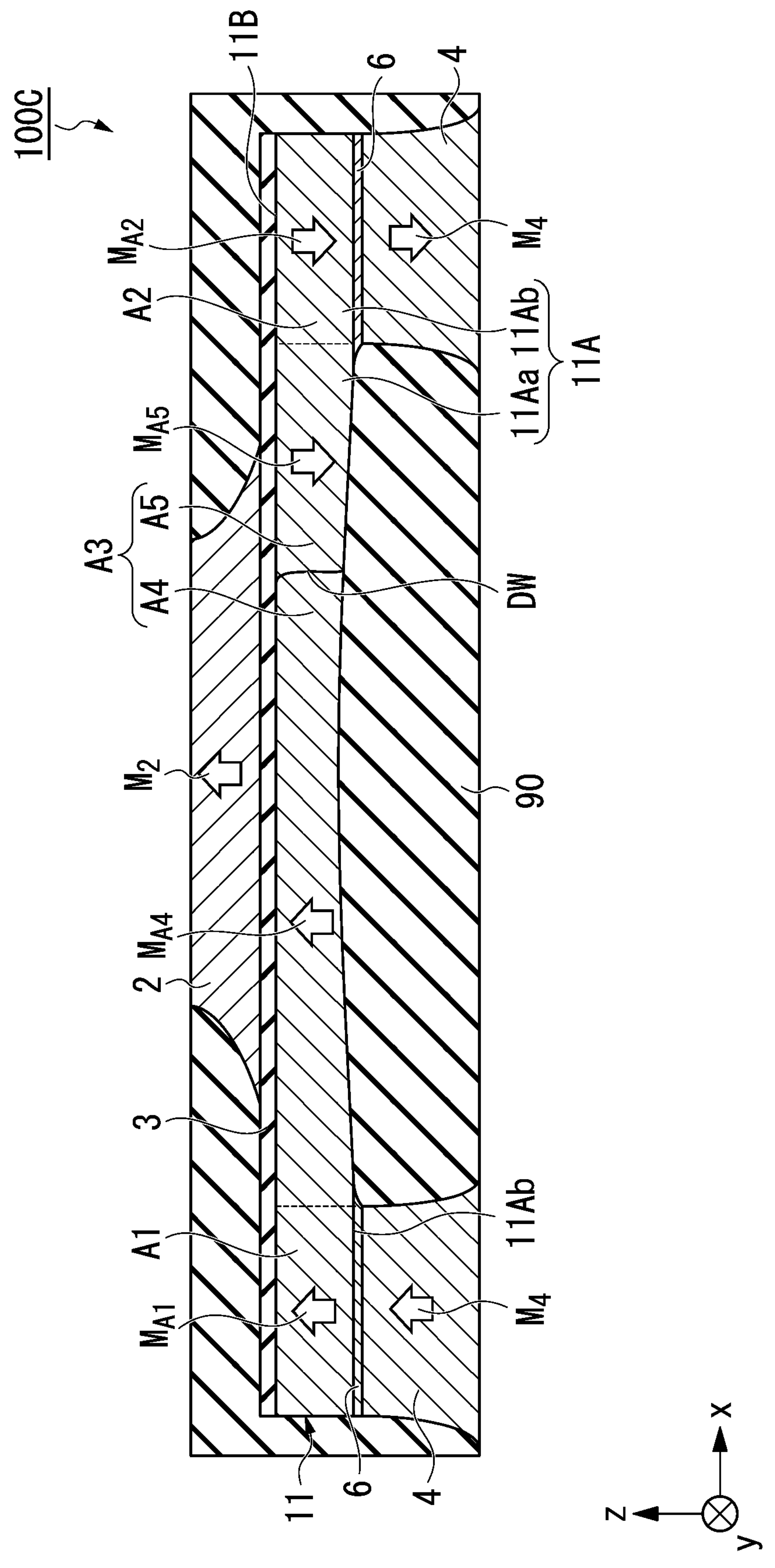
FIG. 10 is a cross-sectional view of a magnetic domain wall motion element according to a third modified example.

FIG. 10 is a cross-sectional view of a magnetic domain wall motion element 100C according to a third modified example. FIG. 10 is a cross-sectional view of the magnetic domain wall motion element 100A taken along an xz plane passing through the center of the wiring layer 10 in the y direction. In the magnetic domain wall motion element 100C, the same components as in the magnetic domain wall motion element 100B are designated by the same reference numerals, and descriptions thereof will be omitted.

The magnetic domain wall motion element 100C has a wiring layer 11. That is. the magnetic domain wall motion element 100C is a combination of the characteristic configuration of the magnetic domain wall motion element 100A and the characteristic configuration of the magnetic domain wall motion element 100B. The magnetic domain wall motion element 100C has a top pin structure, and also in the xz cross section, the first surface 11A is curved in the z direction with respect to the xy plane.

The magnetic domain wall motion element 100C according to the third modified example can achieve the same effects as the magnetic domain wall motion element 100. Further, since the first surface 11A of the wiring layer 11 is curved. the surface area of the first surface 11A becomes large, and heat generated in the wiring layer 11 can be efficiently dissipated.

(Fourth Modified Example)

Figure 11:
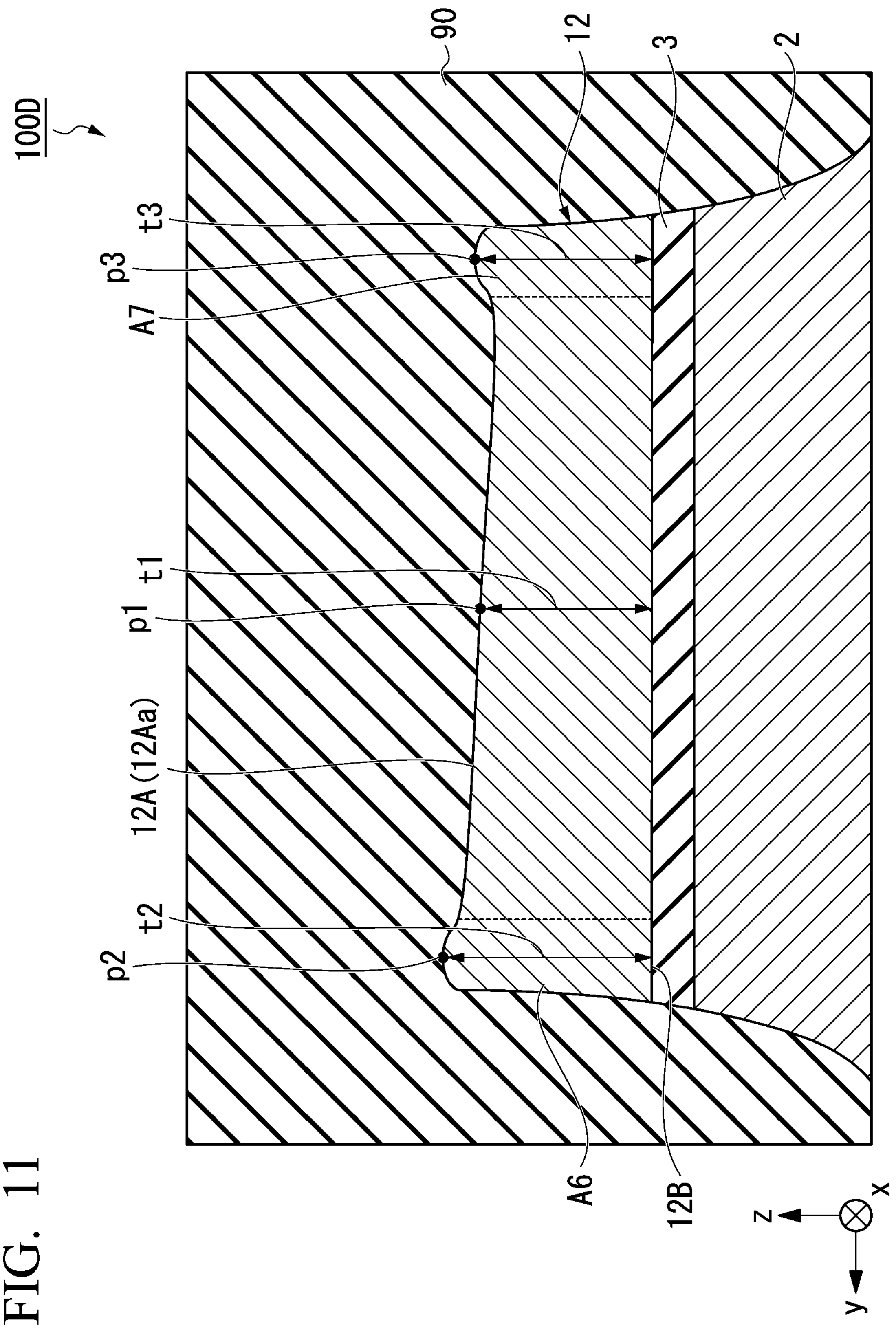
FIG. 11 is a cross-sectional view of a magnetic domain wall motion element according to a fourth modified example.

FIG. 11 is a cross-sectional view of a magnetic domain wall motion element 100D according to a fourth modified example. FIG. 11 is a cross-sectional view of the magnetic domain wall motion element 100D taken along a yz plane passing through the center of a wiring layer 12 in the x direction. A plan view, an xz cross-sectional view, and a yz cross section at a position overlapping the first conductive layer 4 in the magnetic domain wall motion element 100D are the same as the plan view, the xz cross-sectional view, and the yz cross section at the position overlapping with the first conductive layer 4 in the magnetic domain wall motion element 100, respectively. In the magnetic domain wall motion element 100D, the same components as those in the magnetic domain wall motion element 100 are designated by the same reference numerals, and descriptions thereof will be omitted.

The wiring layer 12 differs from the wiring layer 10 in that the second thickness t2 of the first outer peripheral portion A6 and the third thickness t3 of the second outer peripheral portion A7 are different in the yz cross section. The first thickness t1 of the wiring layer 12 is thinner than the second thickness t2 and the third thickness t3.

As shown in FIG. 11, in a non-overlapping region 12Aa, a first surface 12A is curved in the z direction with respect to the xy plane. In the non-overlapping region 12Aa, the first surface 12A is curved such that a first point p1 located at the center of the first surface 12A in the y direction approaches the spacer layer 3. A difference from FIG. 5 is that the first point p1 is not the lowest point.

The magnetic domain wall motion element 100D according to the fourth modified example can achieve the same effects as in the magnetic domain wall motion element 100 according to the first embodiment.

"Second Embodiment"

Figure 12:
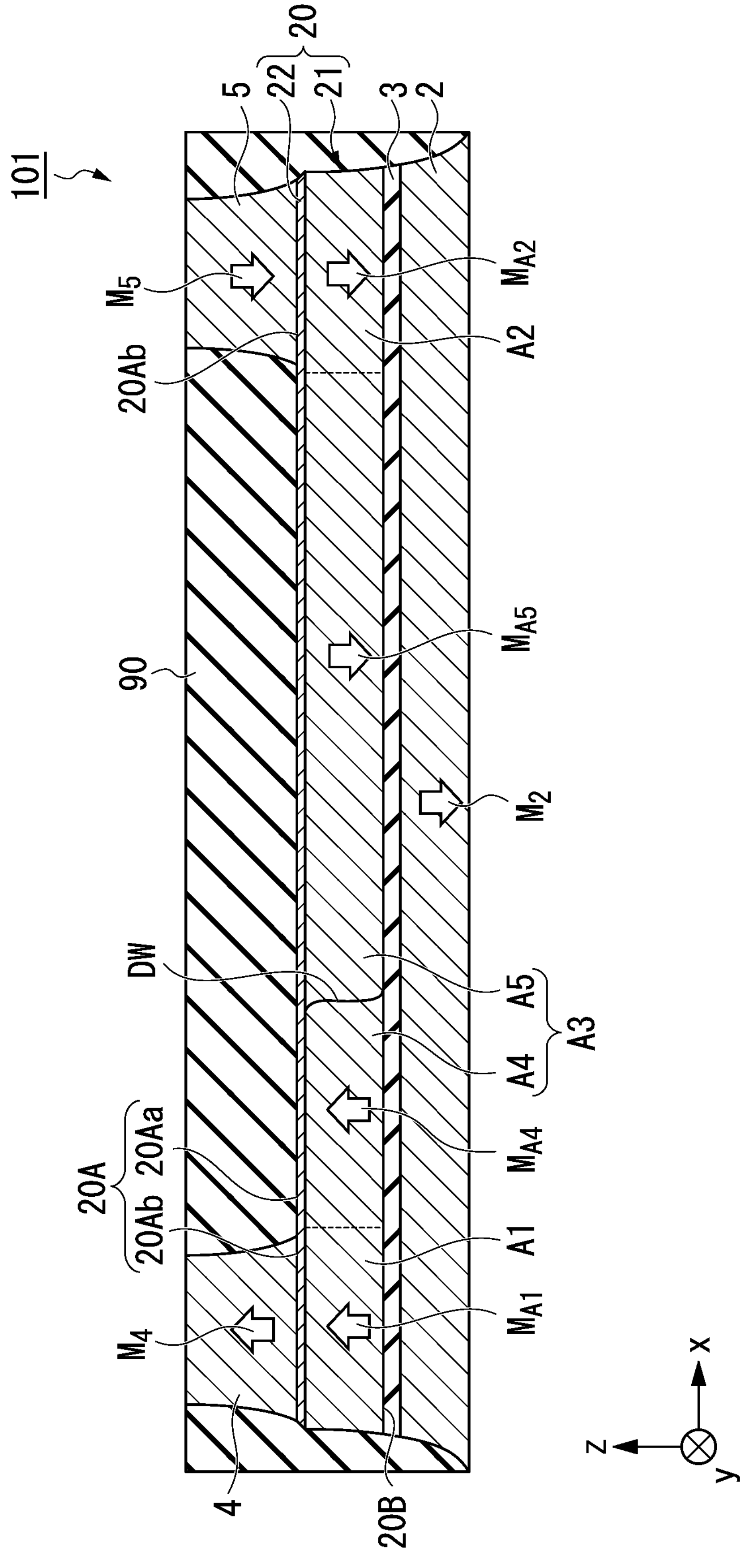
FIG. 12 is a cross-sectional view of a magnetic domain wall motion element according to a second embodiment.
Figure 13:
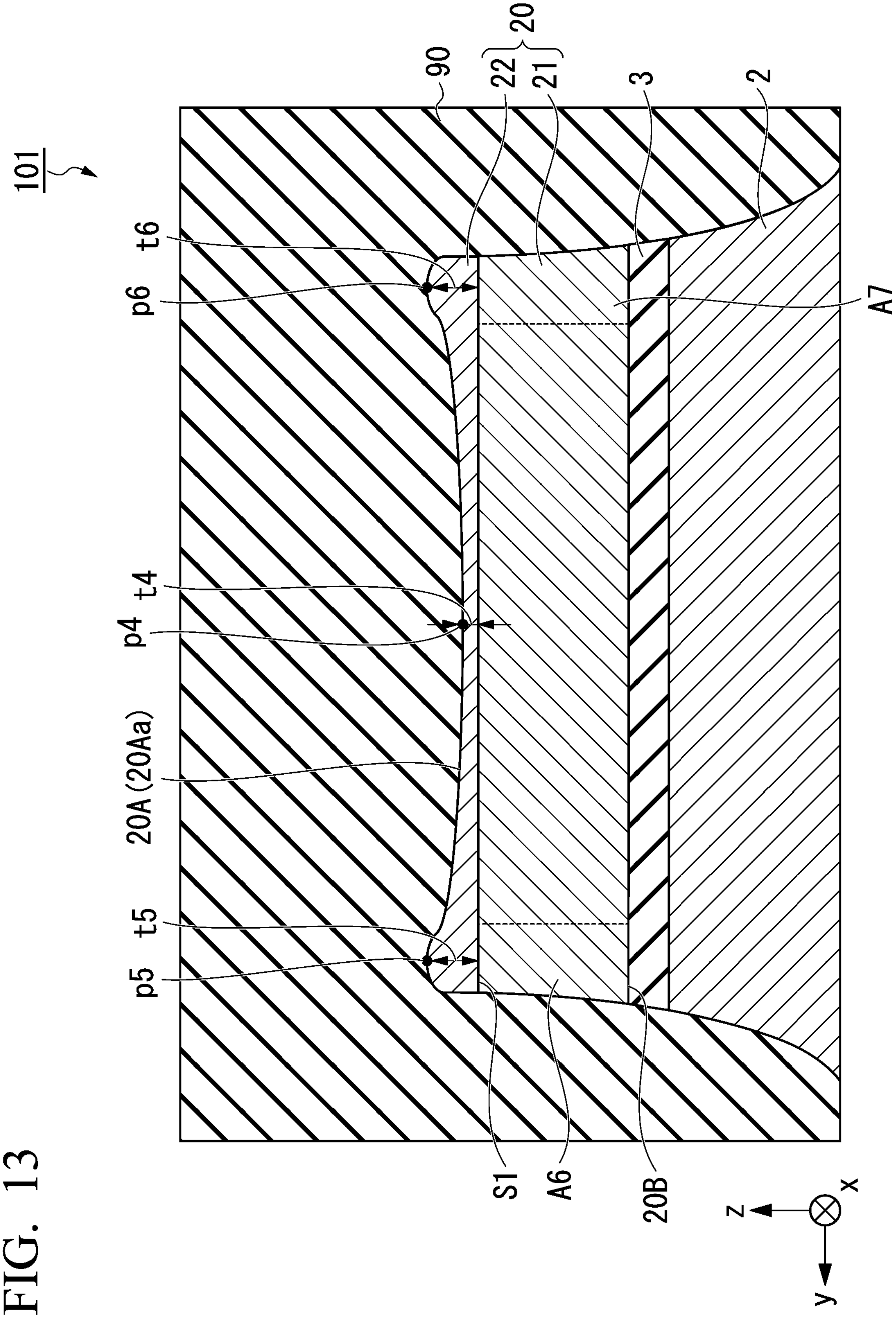
FIG. 13 is another cross-sectional view of the magnetic domain wall motion element according to the second embodiment.

FIGS. 12 and 13 are cross-sectional views of a magnetic domain wall motion clement 101 according to a second embodiment. FIG. 12 is a cross-sectional view of the magnetic domain wall motion element 101 taken along an xz plane passing through the center of a wiring layer 20 in the y direction. FIG. 13 is a cross-sectional view of the magnetic domain wall motion element 101 taken along a yz plane passing through the center of the wiring layer 20 in the x direction. A plan view of the magnetic domain wall motion element 101 and a yz cross-sectional view at a position overlapping with the first conductive layer 4 are the same as the plan view of the magnetic domain wall motion element 100 and the yz cross-sectional view at a position overlapping with the first conductive layer 4, respectively. In the magnetic domain wall motion element 101, the same components as in the magnetic domain wall motion element 100 are designated by the same reference numerals, and description thereof will be omitted.

The wiring layer 20 includes a first ferromagnetic layer 21 and a nonmagnetic layer 22. The wiring layer 20 is similar to the wiring layer 10 except that it has a two-layer structure.

A material constituting the first ferromagnetic layer 21 is the same as that of the first ferromagnetic layer 1. The first ferromagnetic layer 21 has a substantially constant thickness.

The nonmagnetic layer 22 is made of a nonmagnetic material. Preferably, the nonmagnetic layer 22 has electrical conductivity. The resistance of the nonmagnetic layer 22 is higher than the resistance of the first ferromagnetic layer 21, for example. When the resistance of the nonmagnetic layer 22 is high, much of a current flowing through the wiring layer 20 can be distributed to the first ferromagnetic layer 21. The resistance is the product of a material's inherent resistivity and a cross-sectional area of a flow path through which the current flows. A resistivity of the nonmagnetic layer 22 is, for example, 0.001 mΩ·cm or more and 1 mΩ·cm or less. The nonmagnetic layer 22 is made of, for example, Pd, Pt, Ta, W, or the like.

In the cross section shown in FIG. 13, a fourth thickness t4 of the nonmagnetic layer 22 at the center of the wiring layer 20 in the y direction is thinner than a fifth thickness t5 at the first outer peripheral portion A6. Further, the fourth thickness t4 is thinner than a sixth thickness t6 at the second outer peripheral portion A7. The fifth thickness t5 is, for example, the maximum thickness of the nonmagnetic layer 22 in the yz cross section. The sixth thickness t6 is, for example, the maximum thickness or a thickness of the second thickest portion of the nonmagnetic layer 22 in the yz cross section. A portion at which the nonmagnetic layer 22 has the maximum thickness is not limited to an outer peripheral end of the nonmagnetic layer 22, but may be within an outer peripheral portion inward from the outer peripheral end.

In the non-overlapping region 20Aa, the first surface 20A of the wiring layer 20 is curved in the z direction with respect to the xy plane. In the non-overlapping region 20Aa, the first surface 20A is curved such that a fourth point p4 located at the center of the first surface 20A in the y direction approaches the spacer layer 3. The fourth point p4 is closer to the spacer layer 3 than a fifth point p5 which is located outside the fourth point p4 in the y direction. Further, the fourth point p4 is closer to the spacer layer 3 than a sixth point p6 sandwiching the fourth point p4 together with the fifth point p5. The fifth point p5 is, for example, located at the first outer peripheral portion A6. The sixth point p6 is, for example, located at the second outer peripheral portion A7.

The second surface 20B facing the first surface 20A in the non-overlapping region 20Aa is flatter than the first surface 20A. Further, an interface S1 between the first ferromagnetic layer 21 and the nonmagnetic layer 22 is flatter than the first surface 20A.

In the magnetic domain wall motion element 101 according to the second embodiment, the thickness of the nonmagnetic layer 22 at the first outer peripheral portion A6 and the second outer peripheral portion A7 which are susceptible to processing damage is thick. Therefore, the first ferromagnetic layer 21 is less susceptible to processing damage also at the first outer peripheral portion A6 and the second outer peripheral portion A7.

Further, in the magnetic domain wall motion element 101, a cross-sectional area of the yz cross section of the wiring layer 20 is smaller than that in the case in which the first surface 20A is not curved. When the cross-sectional area of the wiring layer 20 is small, the amount of current required to achieve the critical current density can be reduced.

Although the second embodiment has been described in detail above, the second embodiment is not limited to such a configuration, and various modifications are possible. For example, similarly to the first modified example 100A, the first surface 20A may be curved in the z direction with respect to the xy plane in the xz cross section as well. Alternatively, for example, a top pin structure may be used. Further, the wiring layer 20 may be asymmetrical in the y direction.

"Third Embodiment"

Figure 14:
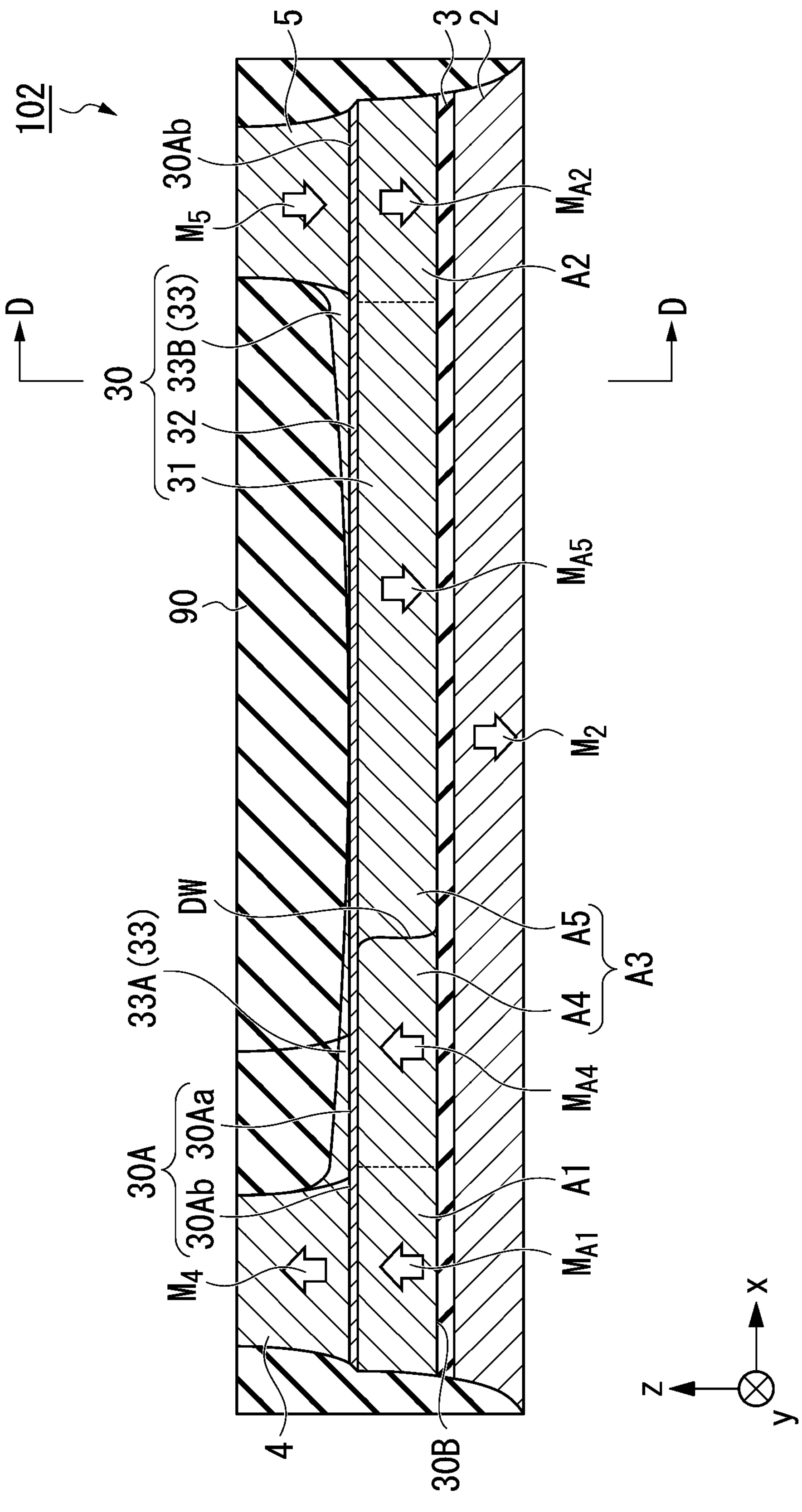
FIG. 14 is a cross-sectional view of a magnetic domain wall motion element according to a third embodiment.
Figure 15:
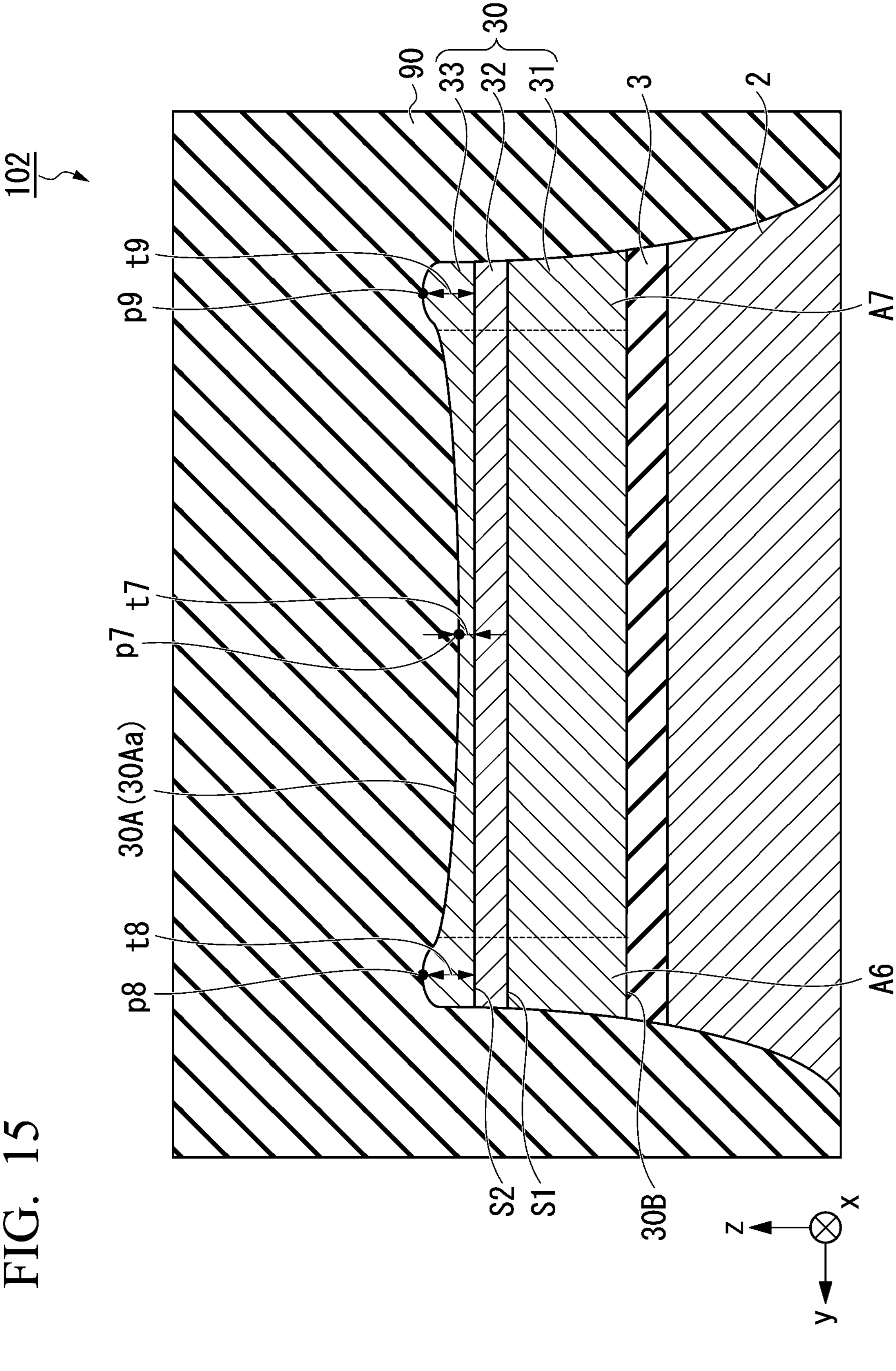
FIG. 15 is another cross-sectional view of the magnetic domain wall motion element according to the third embodiment.

FIGS. 14 and 15 are cross-sectional views of a magnetic domain wall motion element 102 according to a third embodiment. FIG. 14 is a cross-sectional view of the magnetic domain wall motion element 102 taken along an xz plane passing through the center of a wiring layer 30 in the y direction. FIG. 15 is a cross-sectional view of the wiring layer 30 taken along line D-D in FIG. 14. A plan view of the magnetic domain wall motion element 102 and a yz cross-sectional view at a position overlapping the first conductive layer 4 are the same as the plan view of the magnetic domain wall motion element 100 and the yz cross-sectional view at the position overlapping the first conductive layer 4, respectively. In the magnetic domain wall motion element 102, the same components as those in the magnetic domain wall motion element 100 are designated by the same reference numerals, and descriptions thereof will be omitted. The wiring layer 30 includes a first ferromagnetic layer 31, a nonmagnetic layer 32, and a magnetic coupling layer 33. The wiring layer 30 is the same as the wiring layer 10 except that it has a three-layer structure.

A material constituting the first ferromagnetic layer 31 is the same as that of the first ferromagnetic layer 1. The first ferromagnetic layer 31 has a substantially constant thickness.

The nonmagnetic layer 32 is made of a nonmagnetic material. The material constituting the nonmagnetic layer 32 is the same as that of the nonmagnetic layer 22. The nonmagnetic layer 32 has a substantially constant thickness.

The magnetic coupling layer 33 includes a magnetic material. For example, the same material as that of the first ferromagnetic layer 31 or the second ferromagnetic layer 2 may be used for the magnetic coupling layer 33. The magnetic coupling layer 33 is, for example, a laminated film of Co and Ni, a laminated film of Co and Pt, or a laminated film of Co and Pd.

The magnetic coupling layer 33 includes, for example, a first layer 33A and a second layer 33B. The first layer 33A and the second layer 33B are spaced apart in the x direction.

In the cross section shown in FIG. 15, a seventh thickness t7 of the magnetic coupling layer 33 at the center of the wiring layer 30 in the y direction is thinner than an eighth thickness 18 at the first outer peripheral portion A6. Further, the seventh thickness t7 is thinner than a ninth thickness t9 at the second outer peripheral portion A7. The eighth thickness t8 is, for example, the maximum thickness of the magnetic coupling layer 33 in the yz cross section. The ninth thickness t9 is, for example, the maximum thickness of the magnetic coupling layer 33 or a thickness of the second thickest portion in the yz cross section. The portion at which the magnetic coupling layer 33 has the maximum thickness is not limited to an outer peripheral end of the magnetic coupling layer 33, but may be within an outer peripheral portion inward from the outer peripheral end.

In a non-overlapping region 30Aa, a first surface 30A of the wiring layer 30 is curved in the z direction with respect to an xy plane. In the non-overlapping region 30Aa, the first surface 30A is curved such that a seventh point p7 located at the center of the first surface 30A in the y direction approaches the spacer layer 3. The seventh point p7 is closer to the spacer layer 3 than an eighth point p8 which is located outside the seventh point p7 in the y direction. Further, the seventh point p7 is located closer to the spacer layer 3 than a ninth point p9 which sandwiches the seventh point p7 together with the eighth point p8. The eighth point p8 is, for example, located at the first outer peripheral portion A6. The ninth point p9 is, for example, located at the second outer peripheral portion A7.

A second surface 30B facing the first surface 30A in the non-overlapping region 30Aa is flatter than the first surface 30A. Further, an interface S1 between the first ferromagnetic layer 31 and the nonmagnetic layer 32 is flatter than the first surface 30A. Further, an interface S2 between the nonmagnetic layer 32 and the magnetic coupling layer 33 is flatter than the first surface 30A.

In the magnetic domain wall motion element 102 according to the third embodiment, a thickness of the magnetic coupling layer 33 is thick in the first outer peripheral portion A6 and the second outer peripheral portion A7 which are susceptible to processing damage. Therefore, the first ferromagnetic layer 31 is less susceptible to processing damage also in the first outer peripheral portion A6 and the second outer peripheral portion A7. Further, the magnetic coupling layer 33 is magnetically coupled to the first ferromagnetic layer 31 and strengthens magnetic anisotropy of the first ferromagnetic layer 31. Since the thickness of the magnetic coupling layer 33 in the first outer peripheral portion A6 and the second outer peripheral portion A7 which are relatively susceptible to processing damage is thick, the magnetic anisotropy of the first ferromagnetic layer 31 in the first outer peripheral portion A6 and the second outer peripheral portion A7 is particularly enhanced, and the stability of magnetization is also increased in the first outer peripheral portion A6 and the second outer peripheral portion A7.

Further, in the magnetic domain wall motion element 102, the cross-sectional area of the yz cross section of the wiring layer 30 is smaller than that in the case in which the first surface 30A is not curved. When the cross-sectional area of the wiring layer 30 is small, the amount of current required to achieve the critical current density can be reduced.

Although the third embodiment has been described in detail above, the third embodiment is not limited to such a configuration, and various modifications are possible. For example, similarly to the first modified example 100A. the first surface 30A may be curved in the z direction with respect to the xy plane in the xz cross section as well. Alternatively, for example, a top pin structure may be used. Further, the wiring layer 30 may be asymmetrical in the y direction.

(Fifth Modified Example)

Figure 16:
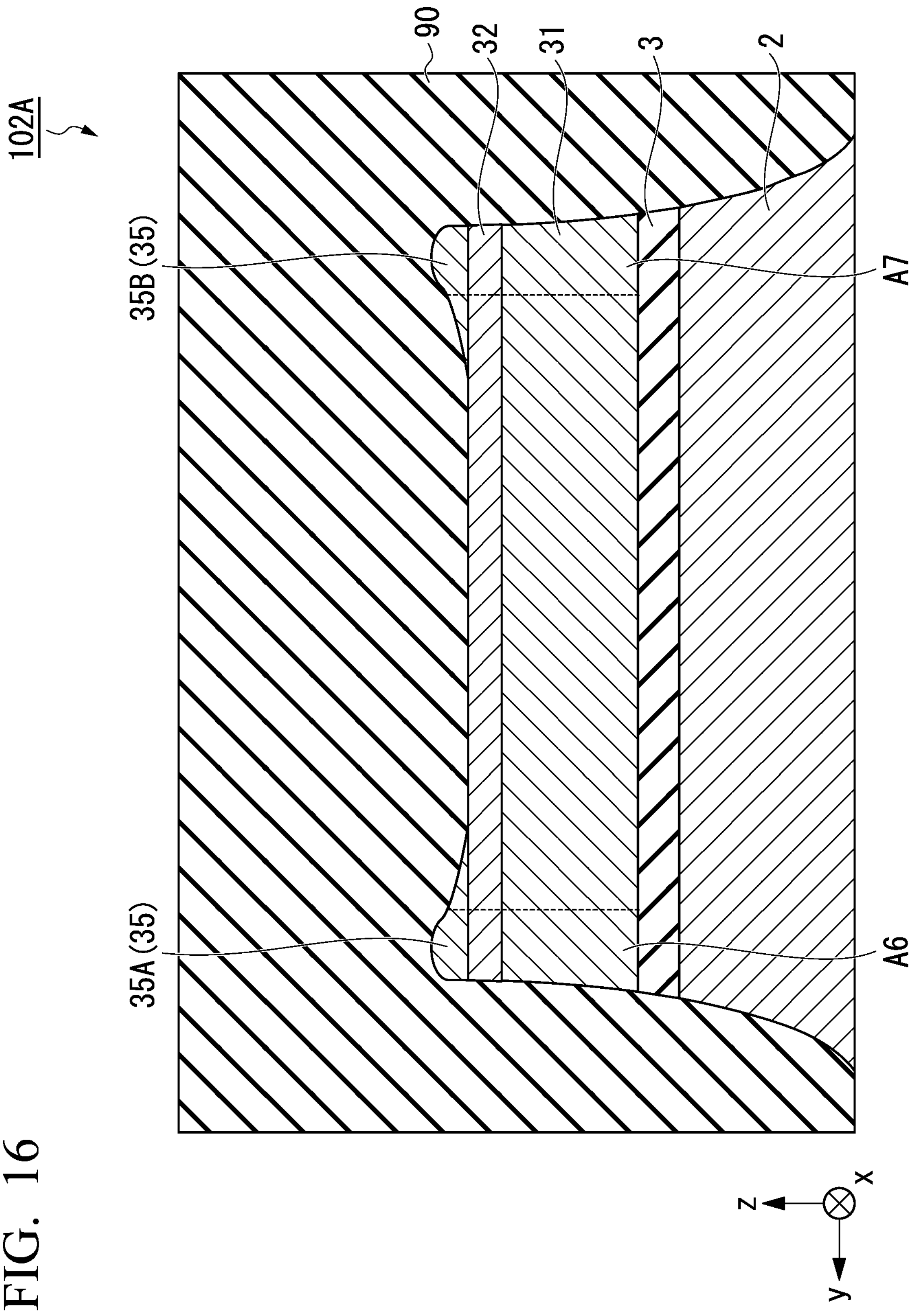
FIG. 16 is a cross-sectional view of a magnetic domain wall motion element according to a fifth modified example.

FIG. 16 is a cross-sectional view of a magnetic domain wall motion element 102A according to a fifth modified example. FIG. 16 is a cross-sectional view of the magnetic domain wall motion element 102A taken along a yz plane passing through the center of the wiring layer 30 in the x direction. An xz cross-sectional view of the magnetic domain wall motion element 102A is similar to the xz cross-sectional view of the magnetic domain wall motion element 102. A plan view of the magnetic domain wall motion element 102A is similar to the plan view of the magnetic domain wall motion element 100. In the magnetic domain wall motion element 102A, the same components as those of the magnetic domain wall motion element 102 are designated by the same reference numerals, and descriptions thereof will be omitted.

The magnetic coupling layer 35 differs from the magnetic coupling layer 33 in that it is also separated in the y direction. The same material as that of the magnetic coupling layer 33 can be used for the magnetic coupling layer 35. The magnetic coupling layer 35 includes a first magnetic coupling layer 35A and a second magnetic coupling layer 35B.

The first magnetic coupling layer 35A is on the first outer peripheral portion A6. The second magnetic coupling layer 35B is on the second outer peripheral portion A7. The first magnetic coupling layer 35A and the second magnetic coupling layer 35B are located at positions sandwiching the center of the wiring layer 30 in the y direction.

The magnetic domain wall motion element 102A according to the fifth modified example can achieve the same effects as the magnetic domain wall motion element 102 according to the third embodiment. Although FIG. 16 shows an example in which the thickness of the nonmagnetic layer 32 is approximately constant. the thickness of the nonmagnetic layer 32 at the center in the y direction may be thinner than the thickness at the first outer peripheral portion A6 and the second outer peripheral portion A7. Further, the thickness of the nonmagnetic layer 32 at the center in the y direction may be zero, and the nonmagnetic layer 32 may be separated in the y direction. Furthermore. the thickness of the first ferromagnetic layer 31 at the center in the y direction may be thinner than the thickness at the first outer peripheral portion A6 and the second outer peripheral portion A7.

(Sixth Modified Example)

Figure 17:
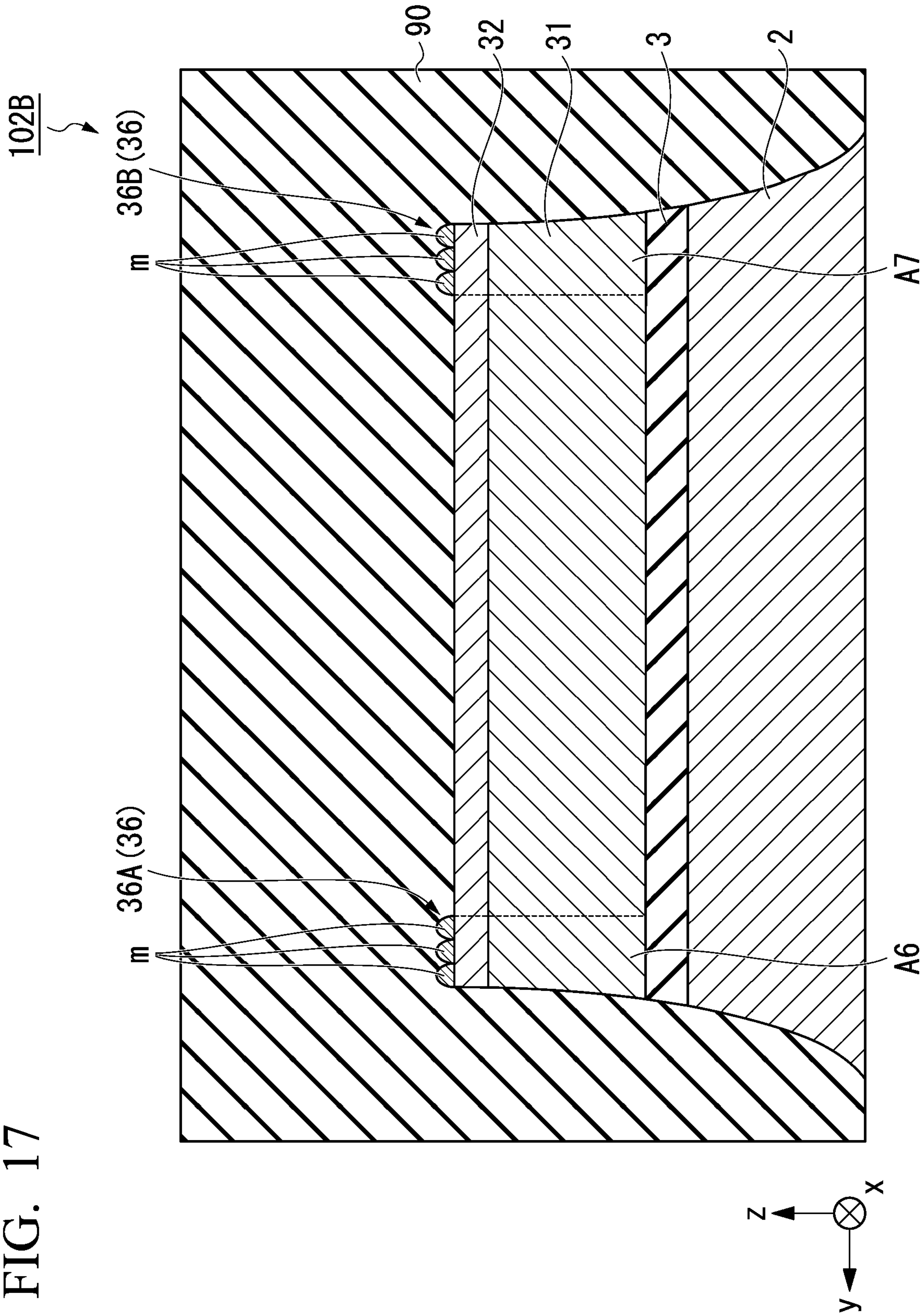
FIG. 17 is a cross-sectional view of a magnetic domain wall motion element according to a sixth modified example.

FIG. 17 is a cross-sectional view of a magnetic domain wall motion element 102B according to a sixth modified example. FIG. 17 is a cross-sectional view of the magnetic domain wall motion element 102B taken along a yz plane passing through the center of the wiring layer 30 in the x direction. An xz cross-sectional view of the magnetic domain wall motion element 102B is similar to the xz cross-sectional view of the magnetic domain wall motion element 102. A plan view of the magnetic domain wall motion element 102B is similar to the plan view of the magnetic domain wall motion element 100. In the magnetic domain wall motion element 102B, the same components as those of the magnetic domain wall motion element 102 are designated by the same reference numerals, and descriptions thereof will be omitted.

The magnetic coupling layer 36 differs from the magnetic coupling layer 33 in that it is also separated in the y direction. The same material as that of the magnetic coupling layer 33 can be used for the magnetic coupling layer 36. The magnetic coupling layer 36 includes a first magnetic coupling layer 36A and a second magnetic coupling layer 36.

The first magnetic coupling layer 36A is on the first outer peripheral portion A6. The second magnetic coupling layer 36B is on the second outer peripheral portion A7. The first magnetic coupling layer 36A and the second magnetic coupling layer 36B are located at positions sandwiching the center of the wiring layer 30 in the y direction.

Each of the first magnetic coupling layer 36A and the second magnetic coupling layer 36B may include a plurality of pieces of magnetic material m scattered in an island shape. The same material as that of the magnetic coupling layer 33 can be used for the magnetic material m. The magnetic material m protrudes from an upper surface of the nonmagnetic layer 32 in an island shape. The pieces of magnetic material m are scattered on the upper surface of the nonmagnetic layer 32.

The magnetic domain wall motion element 102B according to the sixth modified example can achieve the same effects as the magnetic domain wall motion element 102 according to the third embodiment. Further, the magnetic domain wall DW is trapped near a portion at which the magnetic material m is present. By trapping the magnetic domain wall DW, the moving speed of the magnetic domain wall DW can be curbed, and resolution of the magnetic domain wall motion element can be improved.

Further, in the fifth modified example and the sixth modified example, although an example in which the thickness of the nonmagnetic layer 32 is substantially constant has been shown, the thickness of the nonmagnetic layer 32 at the center in the y direction may be thinner than the thickness at the first outer peripheral portion A6 and the second outer peripheral portion A7. Further, the thickness of the nonmagnetic layer 32 at the center in the y direction may be zero, and the nonmagnetic layer 32 may be separated in the y direction. Furthermore, the thickness of the first ferromagnetic layer 31 at the center in the y direction may be thinner than the thickness at the first outer peripheral portion A6 and the second outer peripheral portion A7.

REFERENCE SIGNS LIST

1, 21, 31 First ferromagnetic layer
2 Second ferromagnetic layer
3 Spacer layer
4 First conductive layer
5 Second conductive layer
6, 22, 32 Nonmagnetic layer
10, 11, 12, 20, 30 Wiring layer
10A, 11A, 12A, 20A, 30A First surface
10Aa, 11Aa, 12Aa, 20Aa, 30Aa Non-overlapping region

10Ab, 11Ab, 12Ab, 20Ab, 30Ab Overlapping region
10B, 11B, 20B, 30B Second surface
33, 35, 36 Magnetic coupling layer
33A First layer
33B Second layer
35A, 36A First magnetic coupling layer
35B, 36B Second magnetic coupling layer
90 Insulating layer
100, 100A, 100B, 100C, 100D, 101, 102, 102A, 102B Magnetic domain wall motion element
200 Magnetic recording array
A1 First region
A2 Second region
A3 Third region
A4 First magnetic domain
A5 Second magnetic domain
A6 First outer peripheral portion
A7 Second outer peripheral portion
DW Magnetic domain wall
m Magnetic material
p1 First point
p2 Second point
p3 Third point
p4 Fourth point
p5 Fifth point
p6 Sixth point
p7 Seventh point
p8 Eighth point
p9 Ninth point
S1, S2 Interface

What is claimed is:

1. A magnetic domain wall motion element comprising:
- a wiring layer including a first ferromagnetic layer and configured to extend in a first direction;
- a second ferromagnetic layer; and
- a spacer layer sandwiched between the wiring layer and the second ferromagnetic layer,
- wherein a length of the wiring layer in the first direction is longer than a length of the wiring layer in a direction perpendicular to the first direction, and
- wherein, in any cross section of the wiring layer taken along a plane perpendicular to the first direction, a first thickness of the wiring layer at a center in a width direction is thinner than a second thickness of the wiring layer at a first outer peripheral portion outside the center in the width direction.

2. The magnetic domain wall motion element according to claim 1, wherein the first thickness is thinner than a third thickness of the wiring layer at a second outer peripheral portion that sandwiches the center together with the first outer peripheral portion in the width direction.

3. The magnetic domain wall motion element according to claim 1, wherein, on a first surface of the wiring layer on a side far from the spacer layer, a first point at a center in the width direction is closer to the spacer layer than a second point outside the center in the width direction.

4. The magnetic domain wall motion element according to claim 1, wherein a second surface of the wiring layer that faces a first surface is flatter than the first surface on a side far from the spacer layer.

5. The magnetic domain wall motion element according to claim 1, wherein the wiring layer includes the first ferromagnetic layer and a nonmagnetic layer in order from a side closer to the spacer layer, and
- in any cross section of the wiring layer taken along a plane perpendicular to the first direction, a fourth thickness of the nonmagnetic layer at a center in the width direction is thinner than a fifth thickness of the nonmagnetic layer at the first outer peripheral portion outside the center in the width direction.

6. The magnetic domain wall motion element according to claim 5, wherein an interface between the first ferromagnetic layer and the nonmagnetic layer is flatter than a first surface of the wiring layer on a side far from the spacer layer.

7. The magnetic domain wall motion element according to claim 5, wherein a resistance of the nonmagnetic layer is higher than a resistance of the first ferromagnetic layer.

8. The magnetic domain wall motion element according to claim 1, wherein the wiring layer includes the first ferromagnetic layer, a nonmagnetic layer, and a magnetic coupling layer containing a ferromagnetic material in order from a side closer to the spacer layer.

9. The magnetic domain wall motion element according to claim 8, wherein the magnetic coupling layer includes a first magnetic coupling layer and a second magnetic coupling layer,
- the first magnetic coupling layer is on the first outer peripheral portion, and
- the second magnetic coupling layer is on a second outer peripheral portion that sandwiches the center together with the first outer peripheral portion in the width direction.

10. The magnetic domain wall motion element according to claim 9, wherein each of the first magnetic coupling layer and the second magnetic coupling layer includes a plurality of pieces of magnetic material scattered in an island shape.

11. The magnetic domain wall motion element according to claim 1, further comprising a first conductive layer and a second conductive layer,
- wherein the first conductive layer and the second conductive layer are spaced apart in the first direction and connected to the wiring layer, and
- in a first surface of the wiring layer on a side far from the spacer layer, an overlapping region that overlaps the first conductive layer and the second conductive layer in a lamination direction is flatter than a non-overlapping region other than the overlapping region.

12. The magnetic domain wall motion element according to claim 1, wherein, in any cross section of the wiring layer taken along a plane in the first direction, a thickness of the wiring layer at a center in the first direction is thinner than a thickness of the wiring layer outside the center in the first direction.

13. A magnetic recording array comprising a plurality of magnetic domain wall motion elements according to claim 1.

14. A magnetic memory comprising a plurality of magnetic domain wall motion elements according to claim 1.

* * * * *